US 6,704,234 B2

(12) United States Patent
Mizugaki

(10) Patent No.: US 6,704,234 B2
(45) Date of Patent: *Mar. 9, 2004

(54) SEMICONDUCTOR DEVICE, REFRESHING METHOD THEREOF, MEMORY SYSTEM, AND ELECTRONIC INSTRUMENT

(75) Inventor: Koichi Mizugaki, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/971,914

(22) Filed: Oct. 9, 2001

(65) Prior Publication Data

US 2002/0049884 A1 Apr. 25, 2002

(30) Foreign Application Priority Data

Oct. 20, 2000 (JP) ........................................ 2000-320977

(51) Int. Cl.[7] ................................................ G11C 7/00
(52) U.S. Cl. .................... 365/222; 365/233; 365/230.03
(58) Field of Search ................................. 365/222, 233, 365/230.03, 230.06, 236, 227

(56) References Cited

U.S. PATENT DOCUMENTS 5,831,922 A * 11/1998 Choi ........................... 365/222
2002/0048208 A1 * 4/2002 Mizugaki .................... 365/222
2002/0051398 A1 * 5/2002 Mizugaki .................... 365/222

FOREIGN PATENT DOCUMENTS

| JP | 6-28850 | 2/1994 |
| JP | 6-162768 | 6/1994 |
| JP | 8-147970 | 6/1996 |
| JP | 2000-123568 | 4/2000 |
| JP | 2000-298982 | 10/2000 |
| JP | 2002-203389 | 7/2002 |

OTHER PUBLICATIONS

U.S. patent application Ser. No. 09/972,053, K. Mizugaki filed Oct. 9, 2001.

* cited by examiner

Primary Examiner—David Lam
(74) Attorney, Agent, or Firm—Oliff & Berridge, PLC

(57) ABSTRACT

A method of refreshing a semiconductor device such as a VSRAM. A memory cell array 20 of a semiconductor device 1 is divided into four blocks consisting of a block A, block B, block C, and block D. During a period in which data read or write operations is performed for one of the blocks, refreshing is performed for the other blocks. An RF address controller 120 has a function of making logic of a signal $RFA_{18}$ and a signal $RFA_{19}$ among refresh address signals $RFA_8$ to $RFA_{19}$ constant so that only part of each block of the blocks A to D is refreshed in a power saving state.

20 Claims, 16 Drawing Sheets

SEMICONDUCTOR DEVICE, REFRESHING METHOD THEREOF, MEMORY SYSTEM, AND ELECTRONIC INSTRUMENT

Japanese Patent Application No. 2000-320977, filed on Oct. 20, 2000, is hereby incorporated by reference in its entirety.

BACKGROUND OF THE INVENTION

1. Field of the Invention

The present invention relates to a semiconductor device which holds data by refreshing, a method of refreshing the semiconductor device, a memory system, and an electronic instrument.

2. Description of Related Art

A virtually static RAM (VSRAM) is one type of semiconductor memory. Although memory cells of the VSRAM are the same as memory cells of a DRAM, the VSRAM does not need multiplexing of the column address and the row address. Moreover, the user can use the VSRAM without taking refreshing into consideration (transparency of refreshing).

A certain type of VSRAM is operated in two or more operating states such as a normal operating state and a power saving state. In such a VSRAM, sufficient consideration is not given to internal refreshing performed in each operating state. This problem is not limited to the VSRAM, but is common to dynamic type semiconductor memory devices having a built-in refresh timer and refresh control sections.

SUMMARY OF THE INVENTION

The present invention has been achieved to overcome the above conventional problem. An objective of the present invention is to provide a technique capable of performing refresh operations suitable for a plurality of operating states of a semiconductor memory device.

(1) According to a first aspect of the present invention, there is provided a method of refreshing a semiconductor device having a memory cell array divided into a plurality of blocks, the method comprising:

a first step of making the semiconductor device externally accessible;

a second step of refreshing a block other than a block to be externally accessed among the plurality of blocks of the memory cell array when the semiconductor device is in an externally accessible state;

a third step of making the semiconductor device externally inaccessible; and a fourth step of refreshing only part of the memory cell array when the semiconductor device is in an externally inaccessible state.

(2) A second aspect of the present invention provides a semiconductor device which holds data by refreshing, comprising:

a memory cell array divided into a plurality of blocks;

a refresh address signal generation circuit which generates a first refresh address signal formed of a plurality of signals and is used to select a memory cell to be refreshed in each of the blocks;

a refresh address signal control circuit which generates a second refresh address signal in which logic of part of the signals forming the refresh address signal is made constant in an externally inaccessible state; and a refresh control circuit which refreshes a memory cell in a block other than a block to be externally accessed among the plurality of blocks, based on the first refresh address signal in an externally accessible state of the semiconductor device, and also refreshes a memory cell in each of the blocks, based on the second refresh address signal in the externally inaccessible state.

(3) A third aspect of the present invention provides a memory system comprising the semiconductor device as defined in the above (2).

(4) A fourth aspect of the present invention provides an electronic instrument comprising the semiconductor device as defined in the above (2).

Figure 1:
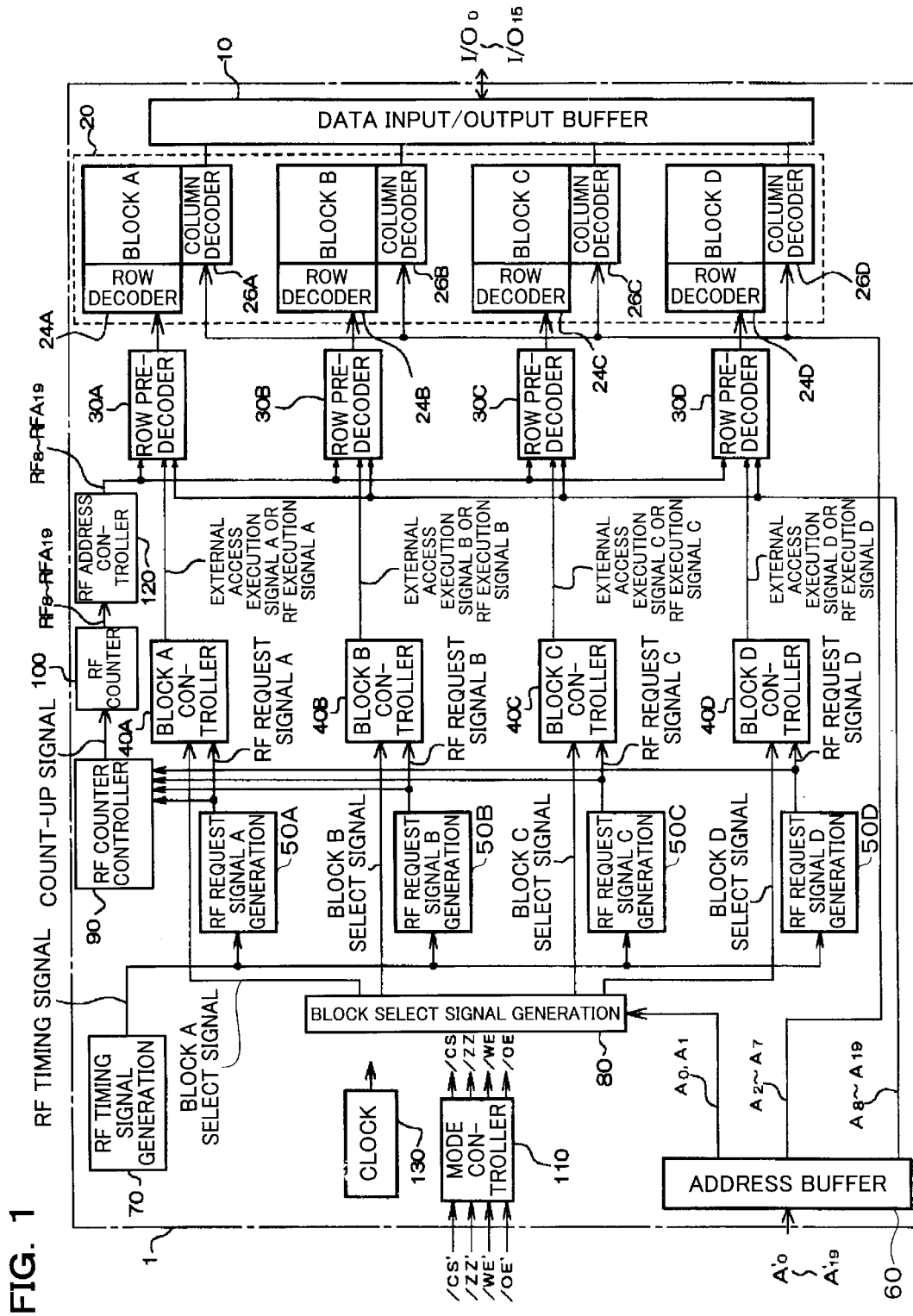
FIG. 1 is a circuit block diagram showing a semiconductor device according to an embodiment of the present invention.

DETAILED DESCRIPTION OF THE EMBODIMENT (1) According to one embodiment of the present invention, there is provided a method of refreshing a semiconductor device having a memory cell array divided into a plurality of blocks, the method comprising:
- a first step of making the semiconductor device externally accessible;
- a second step of refreshing a block other than a block to be externally accessed among the plurality of blocks of the memory cell array when the semiconductor device is in an externally accessible state;
- a third step of making the semiconductor device externally inaccessible; and
- a fourth step of refreshing only part of the memory cell array when the semiconductor device is in an externally inaccessible state.

The semiconductor device according to one embodiment of the present invention needs to be refreshed to hold data. Therefore, electric power is consumed by refreshing even if the semiconductor device is externally inaccessible. In this state, electric power is consumed mainly for refreshing. This embodiment of the present invention performs the refreshing operation only for part of the memory cell array, not to the entire memory cells in the externally inaccessible state of the semiconductor device. Since this embodiment makes it possible to reduce the electric power required for the refreshing, the power consumption can be reduces.

Refreshing only part of the memory cell array means refreshing only the memory cells having data to be held. If the memory cell array has a capacity of 16 Mbits, data to be held is stored in a 4-Mbit area, and only this 4-Mbit area is refreshed, for example. In this case, since the remaining 12-Mbit area is not refreshed in an externally inaccessible state of the semiconductor device, 12 Mbits of data is lost.

According to this embodiment of the present invention, refreshing is performed for only part of the memory cell array in an externally inaccessible state of the semiconductor device. If date to be held is stored in that part, an additional backup memory is not required.

According to this embodiment of the present invention, refreshing is performed for a block to be externally accessed in an externally inaccessible state of the semiconductor device, so that the semiconductor device can be effectively operated.

The externally accessible state of the semiconductor device is an operating state, for example. The externally inaccessible state of the semiconductor device is a power saving state and/or a nonselected state of the semiconductor device, for example.

The number of blocks to be externally accessed may be one or more. The number of blocks to be externally accessed may depend on the design of the semiconductor device.

Refreshing of blocks of the memory cell array means refreshing of a memory cell in a specific row of the blocks, for example. The number of rows to be refreshed may be one or more. The number of rows to be refreshed may depend on the design of the semiconductor device.

External access means reading data from or writing data into the memory cell, for example.

(2) In this refreshing method, a first refresh cycle in the externally inaccessible state of the semiconductor device may be longer than a second refresh cycle in the externally accessible state of the semiconductor device. The first and second refresh cycles depends on the characteristics of the semiconductor device. For example, the first refresh cycle may be two to ten times as long as the second refresh cycle. If the refresh cycles are determined by a divider (or a dividing controller), the first refresh cycle can be two times, four times, or eight times as long as the second refresh cycle, for example.

Refreshing operation is performed for a memory cell, and then for another memory cell. This operation is repeated until all memory cells are refreshed. A cycle for this operation is a refresh cycle. The operation is started at a timing at which a refresh timing signal becomes active, for example.

In this embodiment of the present invention, since only part of the memory cell array is refreshed in an externally inaccessible state of the semiconductor device, the number of memory cells to be refreshed is smaller than that in an externally accessible state of the semiconductor device. Therefore, a refresh cycle in an externally inaccessible state of the semiconductor device can be made longer than a refresh cycle in an externally accessible state of the semiconductor device, so the power consumption can be reduced.

(3) The refreshing method may further comprise:
- a fifth step of generating a refresh address signal which is formed of a plurality of signals and is used to select a memory cell to be refreshed in the memory cell array,
- wherein the fourth step may include a sixth step of making logic of part of the signals forming the refresh address signal constant so that only part of each block of the plurality of blocks is refreshed.

Refreshing only part of each block of the blocks is an example of refreshing only part of the memory cell array. This can be achieved by making logic of part of row address signals or column address signals constant, for example. As other examples of refreshing only part of the memory cell array, only a specific block may be refreshed. This can be achieved by making logic of block address signals constant.

(4) The refreshing method may further comprise:
- a seventh step of selecting a word line of each block of the plurality of blocks so that only part of each block of the plurality of blocks is refreshed, after the sixth step.

(5) The refreshing method may further comprise:
- an eighth step of selecting a row address of each block of the plurality of blocks so that only part of each block of the plurality of blocks is refreshed, after the sixth step.

(6) According to one embodiment of the present invention, there is provided a semiconductor device which holds data by refreshing, comprising:
- a memory cell array divided into a plurality of blocks;
- a refresh address signal generation circuit which generates a first refresh address signal formed of a plurality of signals and is used to select a memory cell to be refreshed in each of the blocks;
- a refresh address signal control circuit which generates a second refresh address signal in which logic of part of the signals forming the refresh address signal is made constant in an externally inaccessible state; and
- a refresh control circuit which refreshes a memory cell in a block other than a block to be externally accessed among the plurality of blocks, based on the first refresh address signal in an externally accessible state of the semiconductor device, and also refreshes a memory cell in each of the blocks, based on the second refresh address signal in the externally inaccessible state.

According to this embodiment of the present invention, the same as described in (1) and (3) can be applied. The refresh address signal generation circuit may be formed of a refresh counter, for example. The refresh address signal control circuit may be formed of a refresh address controller, for example.

(7) The semiconductor device according to one embodiment of the present invention, may further comprise:
- a refresh cycle control circuit which makes a first refresh cycle in the externally inaccessible state of the semiconductor device longer than a second refresh cycle in the externally accessible state of the semiconductor device.

If refreshing is performed based on a refresh timing signal, the refresh cycle control circuit may be formed of a dividing controller which changes a cycle of the refresh timing signal, for example.

(8) The semiconductor device according to one embodiment of the present invention may further comprise:

a plurality of predecoders respectively provided for the plurality of blocks, wherein each of the predecoders may generate a signal for driving a word line which selects a memory cell based on the refresh address signal.

(9) In the semiconductor device according to one embodiment of the present invention, the refresh control circuit may comprise:

a plurality of refresh request signal generation circuits each of which is provided for each of the blocks and generates a refresh request signal to each of the blocks; and a plurality of block controllers each of which is provided for each of the blocks and generates a refresh execution signal to the memory cell located in a block other than a block to be externally accessed among the plurality of blocks, based on the refresh request signal.

(10) The semiconductor device according to one embodiment of the present invention may comprise a virtually static RAM (VSRAM).

(11) According to one embodiment of the present invention, there is provided a memory system comprising the semiconductor device as defined in any one of the above (6) to (10).

(12) According to one embodiment of the present invention, there is provided an electronic instrument comprising the semiconductor device as defined in any one of the above (6) to (10).

An embodiment of the present invention is described below in detail with reference to the drawings. The present embodiment illustrates an example in which the present invention is applied to a VSRAM.

1. Structure of Semiconductor Device

The structure of the present embodiment is described below. FIG. 1 is a circuit block diagram showing a semiconductor device 1 according to the present embodiment. Each block is described below.

(A) 16-bit data ($I/O_0$ to $I/O_{15}$) is input to or output from a data input/output buffer 10.

(B) A memory cell array 20 includes a plurality of memory cells arranged in an array. Each memory cell includes an access transistor which is an n-type MOS transistor, and a capacitor for holding data. The memory cell array 20 is divided into four blocks consisting of a block A, a block B, a block C, and a block D. In the case where the memory cell array 20 has a capacity of 16 Mbits, each block has a capacity of 4 Mbits, for example. In the present invention, the memory cell array 20 is divided into at least two blocks. The number of blocks may be either odd or even.

Each block includes a plurality of word lines, a plurality of pairs of bit lines intersecting the word lines, and the memory cells provided corresponding to the intersection points between the word lines and the pairs of bit lines. The word lines correspond to the memory cells in each row of the blocks. Specifically, the memory cells in a row corresponding to a specific word line are selected by selecting this specific word line.

The blocks A to D includes row decoders 24A to 24D and column decoders 26A to 26D corresponding to each block. The word line is selected by the row decoder. The pair of bit lines is selected by the column decoder. (C) Address signals $A'_0$ to $A'_{19}$ for performing external access (reading or writing, for example) are input to an address buffer 60 from the outside. The address signals $A'_0$ and $A'_1$ are assigned to block address signals $A_0$ and $A_1$. Specifically, the least significant address signal $A'_0$ is assigned to the block address signal $A_0$. The next least significant address signal $A'_1$ is assigned to the block address signal $A_1$. One of the blocks A to D in which the memory cell to be accessed externally is disposed is selected based on the block address signals $A_0$ and $A_1$.

The address signals $A'_2$ to $A'_7$ are assigned to column address signals $A_2$ to $A_7$. The column address signals $A_2$ to $A_7$ are input to the column decoders 26A to 26D. The column addresses of the blocks A to D are selected based on the column address signals $A_2$ to $A_7$.

The address signals $A'_8$ to $A'_{19}$ are assigned to row address signals $A_2$ to $A_{19}$. The row address signals $A_8$ to $A_{19}$ are input to row predecoders 30A to 30D as described later. The row addresses of the blocks A to D are selected based on the row address signals $A_8$ to $A_{19}$. The address signals $A'_0$ to $A'_{19}$ are assigned in the order from the block address signals, the column address signals, and the row address signals. However, the order may differ therefrom.

(D) The block address signals $A_0$ and $A_1$ are input to a block select signal generation circuit 80. The block A select signal to block D select signal are output from the block select signal generation circuit 80.

In the case where the block address signals ($A_0$, $A_1$) are (L level, L level), the block A select signal at H level (active) and the block B, C, D select signals at L level are output from the block select signal generation circuit 80. The block A is selected based on the block A select signal at H level.

In the case where the block address signals ($A_0$, $A_1$) are (H level, L level), the block B select signal at H level (active) and the block A, C, D select signals at L level are output from the block select signal generation circuit 80. The block B is selected based on the block B select signal at H level.

In the case where the block address signals ($A_0$, $A_1$) are (L level, H level), the block C select signal at H level (active) and the block A, B, D select signals at L level are output from the block select signal generation circuit 80. The block C is selected based on the block C select signal at H level.

In the case where the block address signals ($A_0$, $A_1$) are (H level, H level), the block D select signal at H level (active) and the block A, B, C select signals at L level are output from the block select signal generation circuit 80. The block D is selected based on the block D select signal at H level. The block select signal generation circuit 80 is described in detail in the section "3. Block select signal generation circuit".

(E) A refresh (RF) timing signal generation circuit 70 includes a ring oscillation circuit, and generates a refresh (RF) timing signal. The RF timing signal generation circuit 70 periodically sets the RF timing signal to H level (active). Refresh (RF) request signals A to D described below rise to H level (active) based on the rise of the RF timing signal to H level. The RF timing signal generation circuit 70 is described in detail in the section "8. RF timing signal generation circuit".

(F) An RF request signal A generation circuit 50A to an RF request signal D generation circuit 50D are respectively provided corresponding to the blocks A to D, to which the RF timing signal output from the RF timing signal generation circuit 70 is input. The RF request signals A to D are respectively output from the RF request signal A generation circuit 50A to the RF request signal D generation circuit 50D. The RF request signal generation circuits are described in detail in the section "5. RF request signal generation circuit".

(G) A block A controller 40A to a block D controller 40D are respectively provided corresponding to the blocks A to D. The RF request signals A to D and the block A select signal to block D select signal are input to the corresponding block A controller 40A to the block D controller 40D.

The block A controller 40A to the block D controller 40D controller the execution of either external access or refreshing in the corresponding blocks A to D. Specifically, the RF request signals A to D at H level (active) are input to the corresponding block controllers at a certain timing. One of the block controllers to which the block select signal at H level (active) is input (block A controller 40A, for example) outputs an external access execution signal A at H level (active). The memory cell in the block corresponding to the above block controller (block A, for example) is accessed externally based on the external access execution signal.

Since the block select signals at L level (non-active) are input to all the remaining block controllers (block B controller 40B, block C controller 40C, and block D controller 40D, for example), the refresh execution signals at H level (active) are output from these block controllers. The memory cells in a specific row are refreshed in the blocks corresponding to the remaining block controllers (block B, block C, and block D, for example) based on these refresh execution signals. The block controllers are described in detail in the section "4. Block controller".

(H) The RF request signals A to D output from the RF request signal A generation circuit 50A to the RF request signal D generation circuit 50D are input to an RF counter controller 90. The RF counter controller 90 outputs a count-up signal. The count-up signal is input to an RF counter 100. The RF counter controller 90 is described in detail in the section "9. RF counter controller".

(I) The RF counter 100 has the same structure as that of a conventional counter. Refresh address signals $RFA_8$ to $RFA_{19}$ are output from the RF counter 100. The refresh address signals $RFA_8$ to $RFA_{19}$ are input to the row predecoders 30A to 30D through an RF address controller 120. A plurality of memory cells in a row which must be refreshed is selected in the blocks A to D based on the refresh address signals $RFA_8$ to $RFA_{19}$.

(J) The RF address controller 120 has a function of making the logic of the signal $RFA_{18}$ and the signal $RFA_{19}$ among the refresh address signals $RFA_8$ to $RFA_{19}$ constant. This allows only part of the memory cells in each of the blocks A to D to be refreshed in the power saving state. This is one of the features of the present embodiment. This feature is described in detail in the section "7. RF address controller".

(K) The row predecoders 30A to 30D supply signals for driving the word line to the corresponding row decoders 24A to 24D. The operations of the row predecoders 30A to 30D are as follows. The refresh address signals $RFA_8$ to $RFA_{19}$ output from the RF address controller 120 and the row address signals $A_8$ to $A_{19}$ output from the address buffer 60 are input to the row predecoders 30A to 30D. For example, in the case where the block A is accessed externally, the external access execution signal A at H level (active) is input to the row predecoder 30A, and the RF execution signals B, C, and D at H level (active) are input to the row predecoders 30B to 30D. This allows the row predecoder 30A to supply a signal for driving the word line which selects the memory cell to be accessed externally to the row decoder 24A. The row predecoders 30B to 30D supply signals for driving the word line which selects the memory cells in a row to be refreshed to the row decoders 24B to 24D, respectively. The row predecoders 30A to 30D are described in detail in the section "6. Row predecoder".

(L) The semiconductor device 1 includes a mode controller 110. An operating state and a standby state are described before describing the mode controller 110. The semiconductor device 1 has an operating state and a standby state. The semiconductor device 1 is accessible externally in the operating state. The semiconductor device 1 is inaccessible externally in the standby state. Refreshing is performed even if the semiconductor device 1 is in the standby state.

The standby state consists of a nonselected state and a power saving state. The nonselected state is the standby state in which the semiconductor device 1 is not selected by a chip select signal /CS although a system including the semiconductor device 1 is being operated, for example. The power saving state is the standby state in which current consumption of the semiconductor device 1 is minimum.

A chip select signal /CS', a snooze signal /ZZ', a write enable signal /WE', and an output enable signal /OE' are input to the mode controller 110 from the outside. A chip select signal /CS, a snooze signal /ZZ, a write enable signal /WE, and an output enable signal /OE are output from the mode controller 110.

The semiconductor device 1 is in the operating state when the chip select signal /CS is at L level (active) and the snooze signal /ZZ is at H level (non-active). The semiconductor device 1 is in the nonselected state when the chip select signal /CS is at H level (non-active) and the snooze signal /ZZ is at H level (non-active). The semiconductor device 1 is in the power saving state when the chip select signal /CS is at H level (non-active) and the snooze signal /ZZ is at L level (active).

(M) The semiconductor device 1 includes a clock 130. A clock signal output from the clock 130 becomes a standard signal for the operations of the semiconductor device 1 such as external access and refreshing.

2. Refresh Operation of Semiconductor Device

External access (reading or writing of data, for example) to the semiconductor device 1 is the same as that in a conventional SRAM (static random access memory). Therefore, description thereof is omitted. The refresh operations of the semiconductor device 1 are described below separately for the operating state, the nonselected state, and the power saving state.

2.1 Operating State

Figure 2:
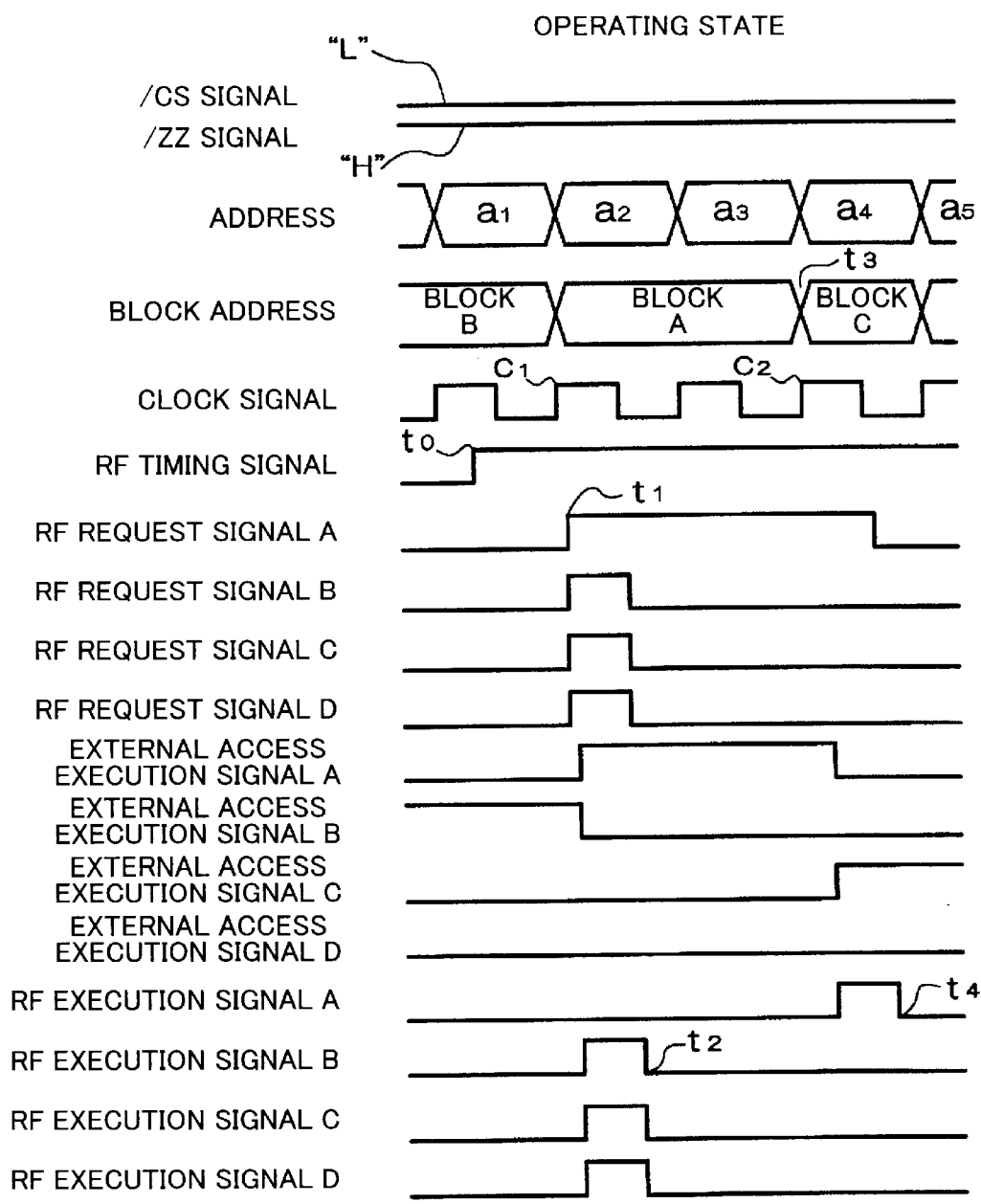
FIG. 2 is a timing chart for describing an operating state of the semiconductor device according to the present embodiment.

The refresh operations of the semiconductor device 1 in the operating state are described below with reference to FIGS. 1 and 2. FIG. 2 is a timing chart for describing the operating state of the semiconductor device 1. The semiconductor device 1 is in the operating state since the chip select signal /CS is at L level and the snooze signal /ZZ is at H level.

The address is an address of the memory cell to be accessed externally. The address is specified by the block address signals $A_0$ and $A_1$, the column address signals $A_2$ to $A_7$, and the row address signals $A_8$ to $A_{19}$.

The block address is an address of the block to be selected (specifically, the block to which the memory cell to be accessed externally belongs). For example, an address $a_1$ exists in the block B, addresses $a_2$ and $a_3$ exist in the block A, and an address $a_4$ exists in the block c.

The RF timing signal rises to H level (active) at time $t_0$. The RF request signals A to D rise to H level (active) based on a first clock signal ($c_1$) in a state in which the RF timing signal is at H level (time $t_1$). The mechanism is described in the section "5.1 Operations in operating state and nonselected state" in "5. RF request signal generation circuit".

The block A is selected at time $t_1$. The external access execution signal A at H level (active) is output from the block A controller 40A based on the clock signal ($c_1$) and the selection of the block A. The RF execution signals B, C, and D are output from the remaining block controllers based on the clock signal $c_1$ and the RF request signals B, C, and D. The mechanism is described in the section "4. Block controller".

After time $t_1$, the memory cell which must be accessed externally (this memory cell is located in block A) is accessed externally by the external access execution signal A. Specifically, the external access (reading or writing, for example) operation is performed for the memory cell selected by the row decoder 24A and the column decoder 26A. In the remaining blocks, the memory cells in a row which must be refreshed (n-th row, for example) are refreshed by the RF execution signals B, C, and D. The mechanism is described in the section "6. Row predecoder".

After a period of time needed for refreshing has elapsed, the RF request signals B, C, and D fall to L level (non-active). This allows the RF execution signals B, C, and D to fall to L level (non-active), whereby refreshing is completed (time $t_2$). The mechanism is described in the section "4. Block controller".

Refreshing of the memory cells in the n-th row which must be refreshed is delayed in the block A during a period in which the block A is selected by the block address. When the block address is changed from the block A to another block, the memory cells in the n-th row which must be refreshed are refreshed in the block A. This is described below in detail. The block address is changed from the block A to the block C at time $t_3$ (generation of clock signal ($c_2$)). Since the RF request signal A is at H level (active), the RF execution signal A at H level is output from the block A controller 40A based on the clock signal ($c_2$) and the RF request signal A at H level. This allows the memory cells in the same row as the row (n-th row) which has refreshed in other blocks during a period in which the block A is selected to be refreshed in the block A. After a period of time needed for refreshing has elapsed, the RF request signal A falls to L level. This allows the RF execution signal A to fall to L level, whereby refreshing is completed (time $t_4$).

Refreshing of the memory cells selected by the word lines in the n-th row in the blocks A to D in the operating state is thus completed.

The word lines in the n-th row in the blocks A to D have the following two meanings. Either of these may be applied to the present embodiment. The word lines according to the first meaning are located at the same geometrical position in the blocks A to D. The word lines according to the second meaning are located in the same row in the address space in the blocks A to D, specifically, the same row with respect to the block controllers. In the case of the second meaning, the geometrical positions of the word lines in the n-th row in the blocks A to D are not necessarily the same.

2.2 Nonselected State

Figure 3:
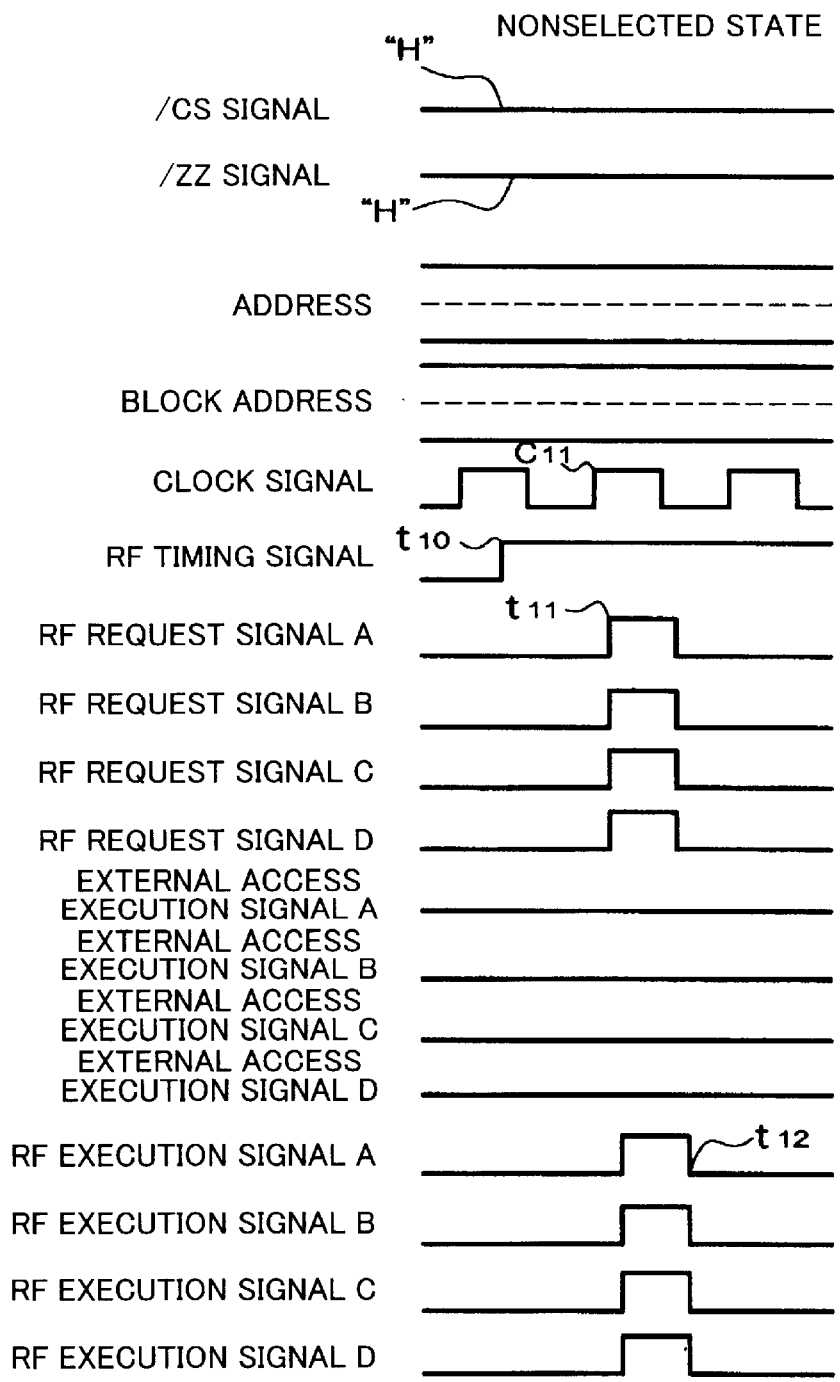
FIG. 3 is a timing chart for describing a nonselected state of the semiconductor device according to the present embodiment.

The refresh operations of the semiconductor device 1 in the nonselected state are described below with reference to FIGS. 1 and 3. FIG. 3 is a timing chart for describing the nonselected state of the semiconductor device 1. The semiconductor device 1 is in the nonselected state since the chip select signal /CS is at H level and the snooze signal /ZZ is at H level.

The RF timing signal rises to H level at time $t_{10}$. The RF request signals A to D rise to H level (active) based on the first leading edge of the clock signal ($c_{11}$) after the RF timing signal rises to H level (time $t_{11}$). The mechanism is described in the section "5.1 Operations in operating state and nonselected state" in "5. RF request signal generation circuit".

Since none of the blocks A to D is selected in the nonselected state, the RF execution signals A to D at H level are output from the block A controller 40A to the block D controller 40D. This allows the memory cells in a row which must be refreshed to be refreshed in the blocks A to D. After a period of time needed for refreshing has elapsed, the RF request signals A to D fall to L level. This allows the RF execution signals A to D to fall to L level, whereby refreshing is completed (time $t_{12}$).

Refreshing of the memory cells connected to the word line in a row which must be refreshed (the n-th row, for example) in the blocks A to D in the nonselected state is thus completed.

2.3 Power Saving State

Figure 4:
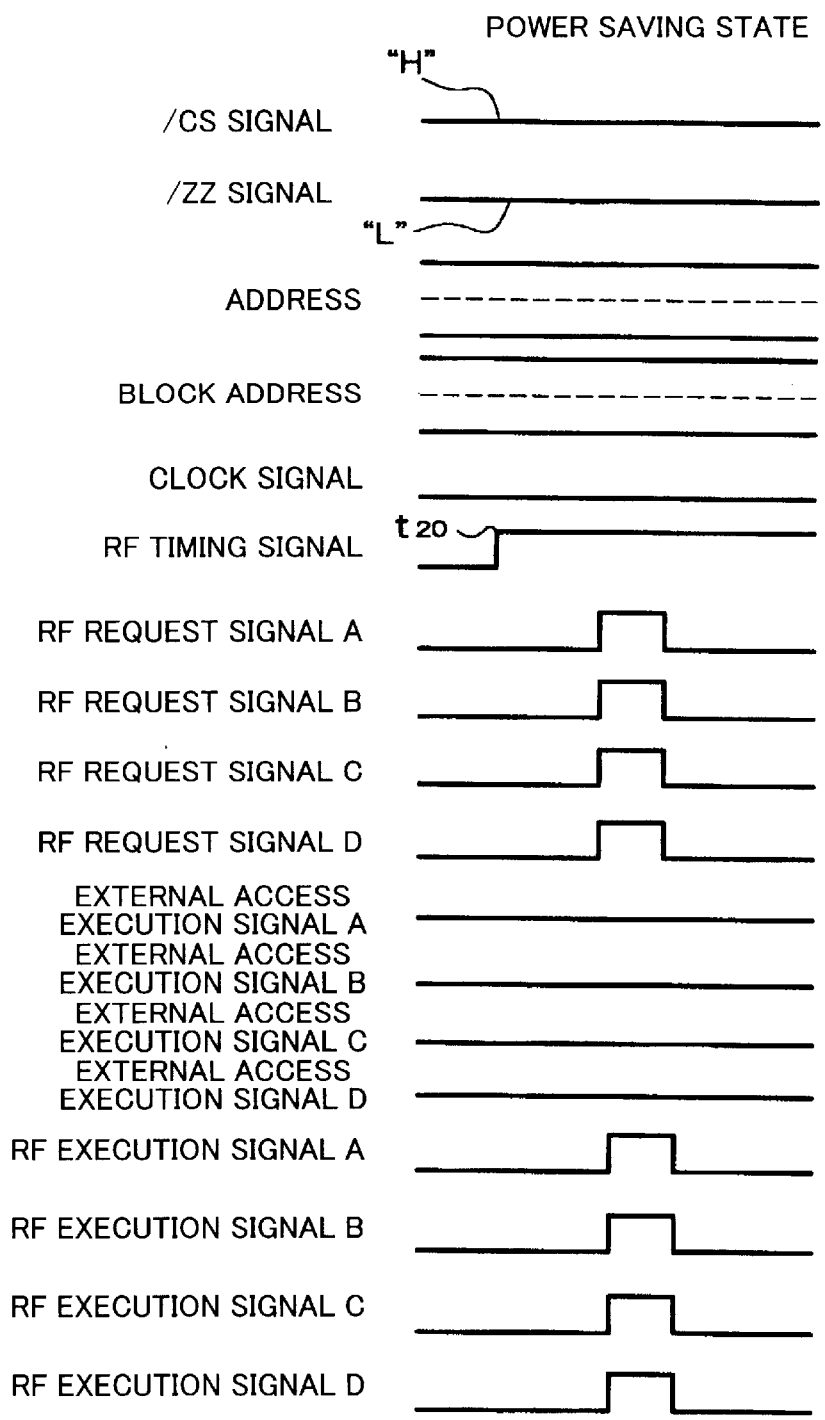
FIG. 4 is a timing chart for describing a power saving state of the semiconductor device according to the present embodiment.

The refresh operations of the semiconductor device 1 in the power saving state are described below with reference to FIGS. 1 and 4. FIG. 4 is a timing chart for describing the power saving state of the semiconductor device 1. The semiconductor device 1 is in the power saving state since the chip select signal /CS is at H level and the snooze signal /ZZ is at L level.

The clock signal is terminated in the power saving state. Therefore, refreshing is performed based on the rise of the RF timing signal. Specifically, the RF timing signal rises to H level (active) at time $t_{20}$. This allows the RF request signals A to D to rise to H level (active). The mechanism is described in the section "5.2 Operations in power saving state" in "5. RF request signal generation circuit". Operations thereafter are the same as the operations after time $t_{11}$ described in "2.2 Nonselected state".

As described above, refreshing operations of the semiconductor device 1 are performed. In the present embodiment, the memory cells selected by the word line in the n-th row are refreshed in each of the blocks A to D. The memory cells selected by the word line in the (n+1)th row are then refreshed in each of the blocks A to D. After the memory cells selected by the word line in the final row (4095th row in the present embodiment) have been refreshed, the memory cells selected by the word line in the first row (0th row) are refreshed. This operation is repeatedly performed. A cycle of this operation is a refresh cycle. The refresh cycle is a time period from one leading edge of the RF timing signal to the next leading edge of the RF timing signal (see FIG. 14), for example.

The major effects of the present embodiment are described below. In the present embodiment, during a period of time in which one block (block A, for example) is accessed externally in the operating state, the memory cells in a row which must be refreshed are refreshed in all the remaining blocks (blocks B, C, and D, for example), as shown in FIG. 2. Therefore, the semiconductor device 1 can be operated efficiently.

In the present embodiment, the blocks A to D are selected by the block address signals $A_0$ and $A_1$. Specifically, among the external address signals $A'_0$ to $A'_{19}$, lower order address signals are assigned to the block address signals. Since the address signals frequently change as the order becomes lower, the block accessed externally always tends to be changed. Therefore, assigning the block address signals in this manner can prevent refreshing from being continuously delayed in one block. Therefore, refresh reliability in all the blocks can be increased.

3. Block Select Signal Generation Circuit

Figure 5:
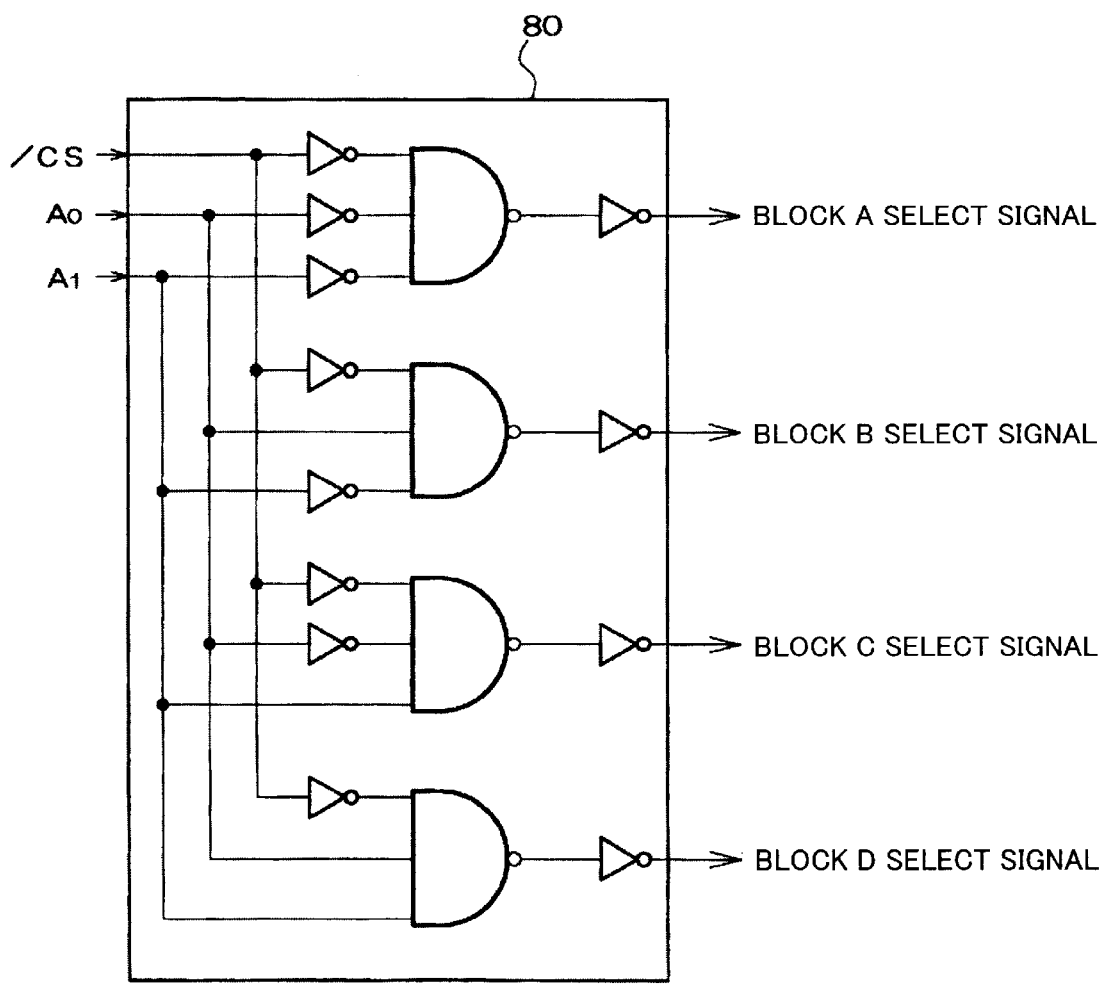
FIG. 5 is a circuit block diagram showing a block select signal generation circuit provided in the semiconductor device according to the present embodiment.

The block select signal generation circuit 80 is described below in detail with reference to FIG. 5. FIG. 5 is a circuit block diagram showing the block select signal generation circuit 80. The chip select signal /CS and the block address signals $A_0$ and $A_1$ are input to the block select signal generation circuit 80. The block A select signal to block D select signal are output from the block select signal generation circuit 80. The logic circuits of the block select signal generation circuit 80 are configured so that the following conditions (A) to (E) are satisfied.

(A) In the case where the chip select signal /CS is at L level and the block address signals ($A_0$, $A_1$) are (L level, L level), the block A select signal at H level (active), and the block B select signal, the block C select signal, and the block D select signal at L level (non-active) are output from the block select signal generation circuit 80.

(B) In the case where the chip select signal /CS is at L level and the block address signals ($A_0$, $A_1$) are (H level, L level), the block B select signal at H level (active), and the block A select signal, the block C select signal, and the block D select signal at L level (non-active) are output from the block select signal generation circuit 80.

(C) In the case where the chip select signal /CS is at L level and the block address signals ($A_0$, $A_1$) are (L level, H level), the block c select signal at H level (active), and the block A select signal, the block B select signal, and the block D select signal at L level (non-active) are output from the block select signal generation circuit 80.

(D) In the case where the chip select signal /CS is at L level and the block address signals ($A_0$, $A_1$) are (H level, H level), the block D select signal at H level (active), and the block A select signal, the block B select signal, and the block C select signal at L level (non-active) are output from the block select signal generation circuit 80.

(E) In the case where the chip select signal /CS is at H level, the block A select signal, the block B select signal, the block c select signal, and the block D select signal at L level (non-active) are output from the block select signal generation circuit 80.

4. Block Controller

Figure 6:
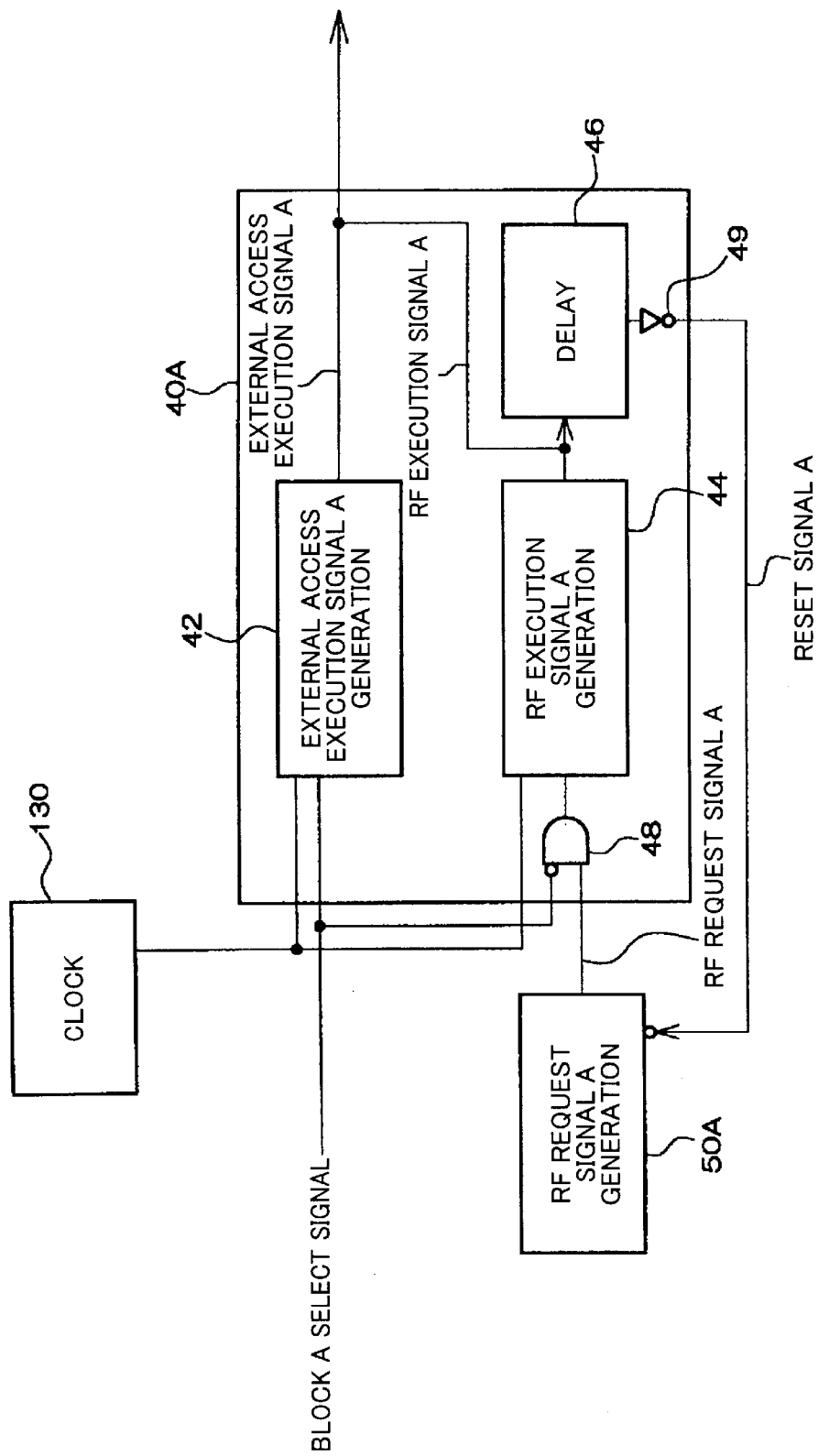
FIG. 6 is a circuit block diagram showing a block A control circuit and circuits relating to the block A control circuit provided in the semiconductor device according to the present embodiment.

The block controllers are described below in detail taking the block A controller 40A as an example. FIG. 6 is a circuit block diagram showing the block A controller 40A and circuits relating to the block A controller 40A. The block A controller 40A includes an external access execution signal A generation circuit 42, an RF execution signal A generation circuit 44, a delay circuit 46, an AND gate 48, and an inverter 49.

The operations in the case where the block A is selected (accessed externally) are described below. In this case, the block A select signal at H level (active) and the RF request signal A at H level (active) are input to the block A controller 40A.

This allows the block A select signal at H level and the RF request signal A at H level to be input to the AND gate 48. This allows a signal at L level to be output from the AND gate 48, and input to the RF execution signal A generation circuit 44.

The block A select signal at H level is input to the external access execution signal A generation circuit 42.

The clock signal output from the clock 130 is input to the external access execution signal A generation circuit 42 and the RF execution signal A generation circuit 44. Since the block A select signal at H level is input to the external access execution signal A generation circuit 42, the external access execution signal A at H level (active) is output from the external access execution signal A generation circuit 42 based on the clock signal. Since the signal at L level output from the AND gate 48 is input to the RF execution signal A generation circuit 44, the RF execution signal A at L level (non-active) is output from the RF execution signal A generation circuit 44. The external access execution signal A at H level becomes the output signal from the block A controller 40A.

The operations in the case where the block A is not selected (not accessed externally) are described below. The block A select signal at L level (non-active) and the RF request signal A at H level (active) are input to the block A controller 40A.

This allows the block A select signal at L level and the RF request signal A at H level to be input to the AND gate 48. This allows a signal at H level to be output from the AND gate 48, and input to the RF execution signal A generation circuit 44.

The block A select signal at L level is input to the external access execution signal A generation circuit 42.

The clock signal output from the clock 130 is input to the external access execution signal A generation circuit 42 and the RF execution signal A generation circuit 44. Since the signal at H level output from the AND gate 48 is input to the RF execution signal A generation circuit 44, the RF execution signal A at H level (active) is output from the RF execution signal A generation circuit 44 based on the clock signal. Since the block A select signal at L level is input to the external access execution signal A generation circuit 42, the external access execution signal A at L level (non-active) is output from the external access execution signal A generation circuit 42. The RF execution signal A at H level (active) becomes the output signal from the block A controller 40A.

The RF execution signal A is also input to the delay circuit 46. Therefore, the RF execution signal A at H level is also input to the delay circuit 46. The delay circuit 46 outputs a reset signal A at H level after a period of time needed for refreshing (20 to 40 ns, for example) has elapsed. This reset signal A is inverted by the inverter 49 to become the reset signal A at L level, and input to a reset (/R) of the RF request signal A generation circuit 50A. As a result, the RF request signal A falls to L level (non-active). This allows the RF execution signal A to fall to L level (non-active), whereby refreshing is completed.

Other block controllers have the same structure as that of the block A controller 40A, and operate in the same manner as the block A controller 40A. As described above, in the present embodiment, the generation of the external access execution signal (H level) from one of the block controllers is synchronized with the generation of the RF execution signals (H level) from all the remaining block controllers, based on the clock signal in the operating state.

5. RF Request Signal Generation Circuit

Figure 7:
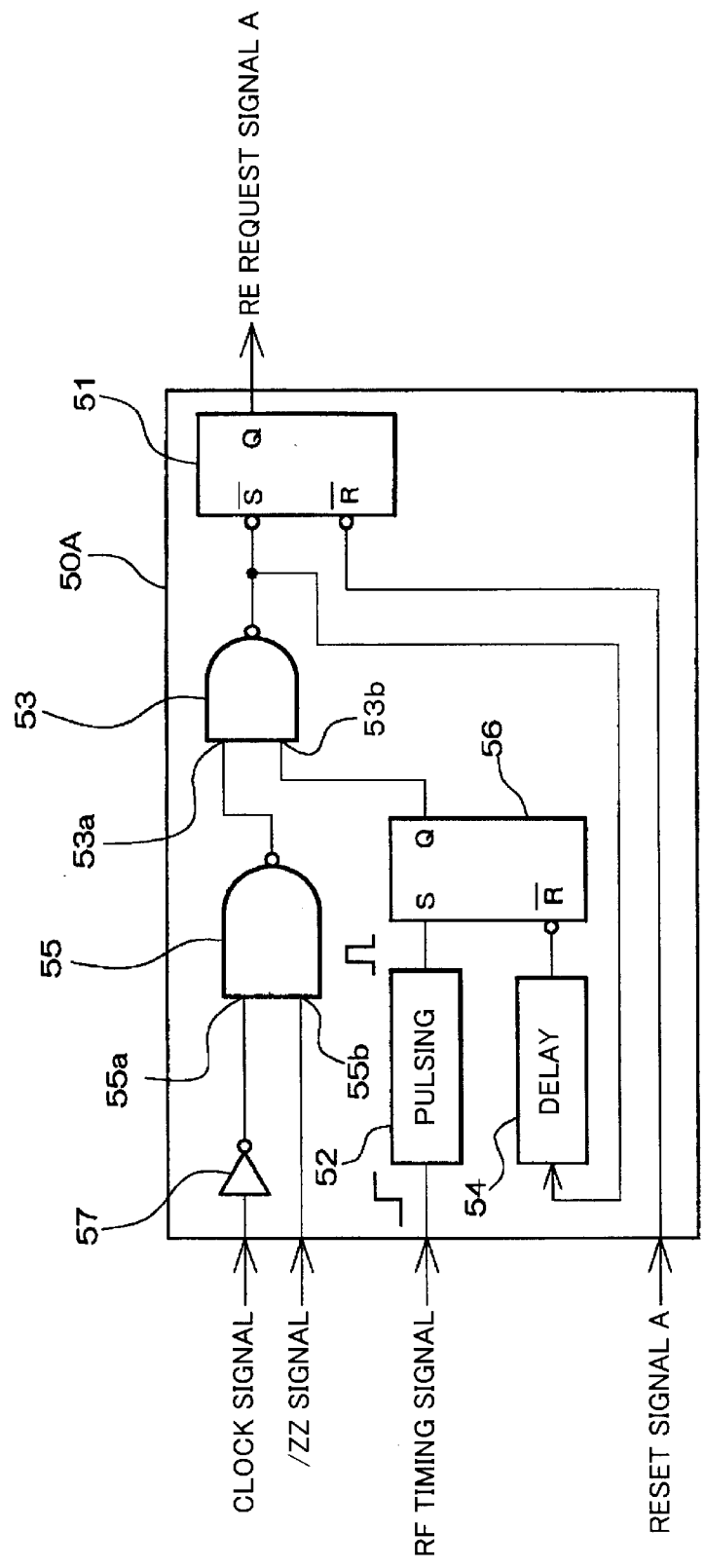
FIG. 7 is a circuit block diagram showing an RF request signal A generation circuit provided in the semiconductor device according to the present embodiment.

The RF request signal generation circuits are described below taking the RF request signal A generation circuit 50A as an example. FIG. 7 is a circuit block diagram showing the RF request signal A generation circuit 50A. The clock signal from the clock 130, the snooze signal /ZZ from the mode controller 110, the RF timing signal from the RF timing signal generation circuit 70, and the reset signal A from the block A controller 40A are input to the RF request signal A generation circuit 50A. The RF request signal A is output from the RF request signal A generation circuit 50A. Specific operations of the RF request signal A generation circuit 50A are described below.

5.1 Operations in Operating State and Nonselected State

When the leading edge of the RF timing signal is input to a pulsing circuit 52, a pulse at H level is generated. When this pulse is applied to an input S of a flip-flop 56, a signal at H level is output from an output Q of the flip-flop 56, and input to an input terminal 53b of a NAND gate 53.

In the operating state and the nonselected state of the semiconductor device 1, the snooze signal /ZZ at H level is input to an input terminal 55b of a NAND gate 55. When the clock signal at H level is input to the RF request signal generation circuit 50, the clock signal at H level is inverted by an inverter 57 and falls to L level. This signal at L level is input to an input terminal 55a of the NAND gate 55. This allows the H level signal output from the NAND gate 55 to be input to an input terminal 53a of the NAND gate 53.

Since the signals at H level are input to the input terminals 53a and 53b, a signal at L level is output from the NAND gate 53, and applied to an input /S of a flip-flop 51. This allows the flip-flop 51 to be reset, whereby a signal at H level is output from an output Q of the flip-flop 51. This signal becomes the RF request signal A at H level (active).

Since the signal at L level output from the NAND gate 53 is also applied to an input /R of the flip-flop 56 through a delay circuit 54, a signal output from an output Q of the flip-flop 56 is at L level. The reasons there for are as follows. Even if the RF request signal A falls to L level (non-active) by allowing the flip-flop 51 to be reset by the reset signal A, the RF request signal A rises to H level (active) when the clock signal (H level) is input, although the leading edge of the RF timing signal is not input.

5.2 Operation in Power Saving State

When the leading edge of the RF timing signal is input to the pulsing circuit 52, a signal at H level is input to the input terminal 53b of the NAND gate 53 in the same manner as in the operations in the operating state and the nonselected state.

In the power saving state of the semiconductor device 1, the snooze signal /ZZ at L level is input to the input terminal 55b of the NAND gate 55. This allows a signal at H level to be output from the NAND gate 55. This signal at H level is input to the input terminal 53a of the NAND gate 53.

Since the signals at H level are input to the input terminals 53a and 53b, the RF request signal A at H level (active) is output from the RF request signal A generation circuit 50A in the same manner as in the operations in the operating state and the nonselected state.

Other RF request signal generation circuits have the same structure as that of the RF request signal A generation circuit 50A, and operate in the same manner as the RF request signal A generation circuit 50A.

6. Row Predecoder

Figure 8:
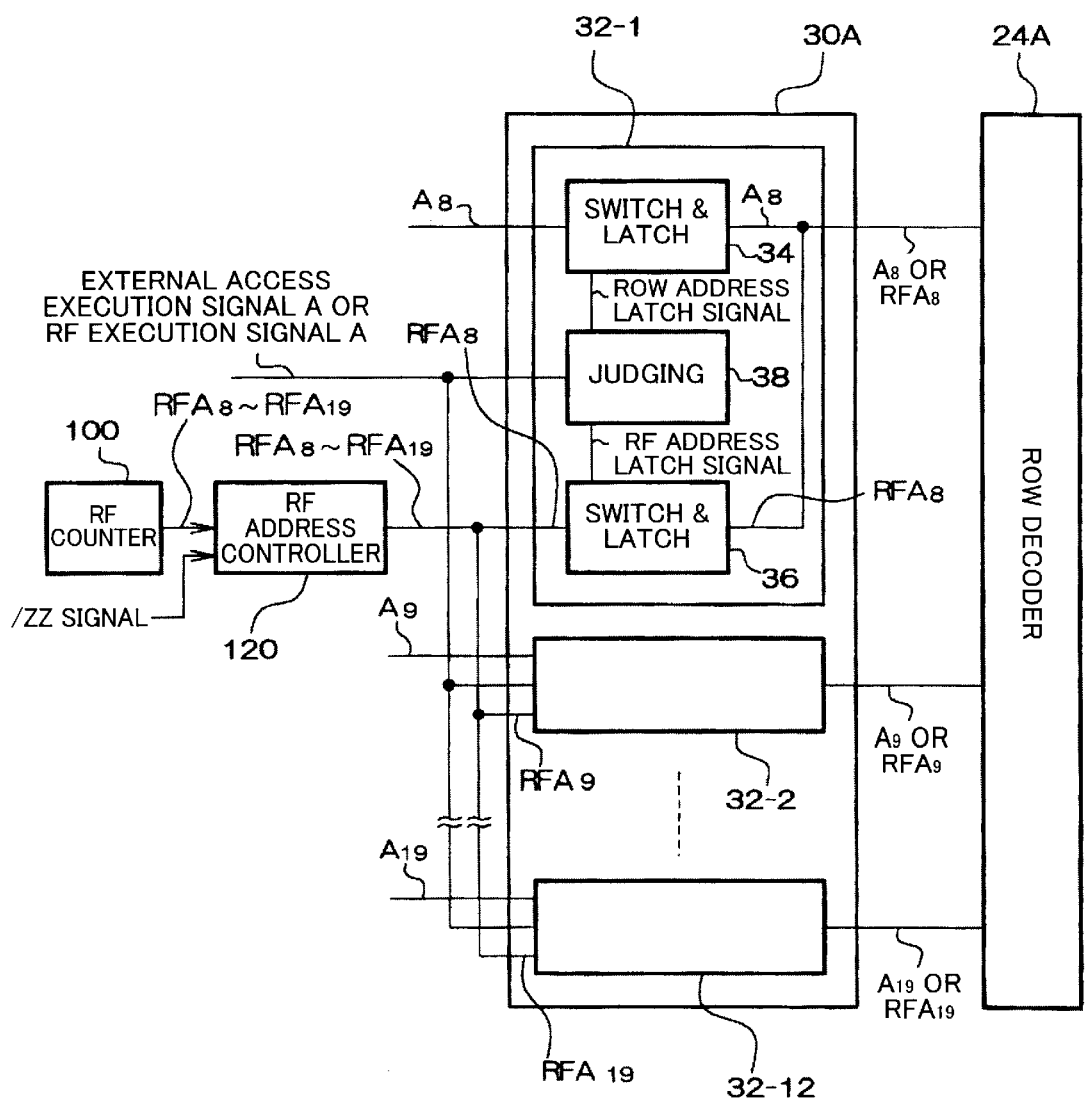
FIG. 8 is a circuit block diagram showing a row predecoder and circuits relating to the row predecoder provided in the semiconductor device according to the present embodiment.

The row predecoders 30A to 30D are described below in detail taking the row predecoder 30A as an example. FIG. 8 is a circuit block diagram showing the row predecoder 30A and circuits relating to the row predecoder 30A. The row predecoder 30A includes twelve selection sections 32-1 to 32-12 corresponding to the number of the row address signals $A_8$ to $A_{19}$. Each of the selection sections 32-1 to 32-12 selects the row address signal or refresh address signal.

Each of the selection sections 32-1 to 32-12 includes switch & latch circuits 34 and 36 and a judging circuit 38. The row address signal (row address signal $A_8$ in the case of selection section 32-1) is input to the switch & latch circuit 34. The refresh address signal (refresh address signal $RFA_8$ in the case of selection section 32-1) output from the RF counter 100 is input to the switch & latch circuit 36 through the RF address controller 120.

A signal output from the block A controller 40A (FIG. 1), specifically, either the external access execution signal A at H level or the RF execution signal A at H level is input to the judging circuit 38. When the judging circuit 38 judges that the external access execution signal A at H level is input to the judging circuit 38, the judging circuit 38 outputs a row address latch signal. Since the row address latch signal is input to the switch & latch circuit 34, the row address signal is latched by the switch & latch circuit 34 and output therefrom. This allows the row predecoder 30A to output the row address signals $A_8$ to $A_{18}$. These signals are for driving the word line which selects the memory cell which must be accessed externally. These drive signals are input to the row decoder 24A. The row decoder 24A selects the word line in a row to which the memory cell to be accessed externally belongs, based on the drive signals.

When the judging circuit 38 judges that the RF execution signal A at H level is input to the judging circuit 38, the judging circuit 38 outputs an RF address latch signal. Since the RF address latch signal is input to the switch & latch circuit 36, the RF address signal is latched by the switch & latch circuit 36 and output therefrom. This allows the row predecoder 30A to output the refresh address signals $RFA_8$ to $RFA_{19}$. These signals are for driving the word line which selects the memory cells in a row which must be refreshed. These drive signals are input to the row decoder 24A. The row decoder 24A selects the word line in a row which must be refreshed based on the drive signals.

The row predecoders 30B to 30D have the same structure as that of the row predecoder 30A, and operate in the same manner as the row predecoder 30A.

7. RF Address Controller

Figure 9:
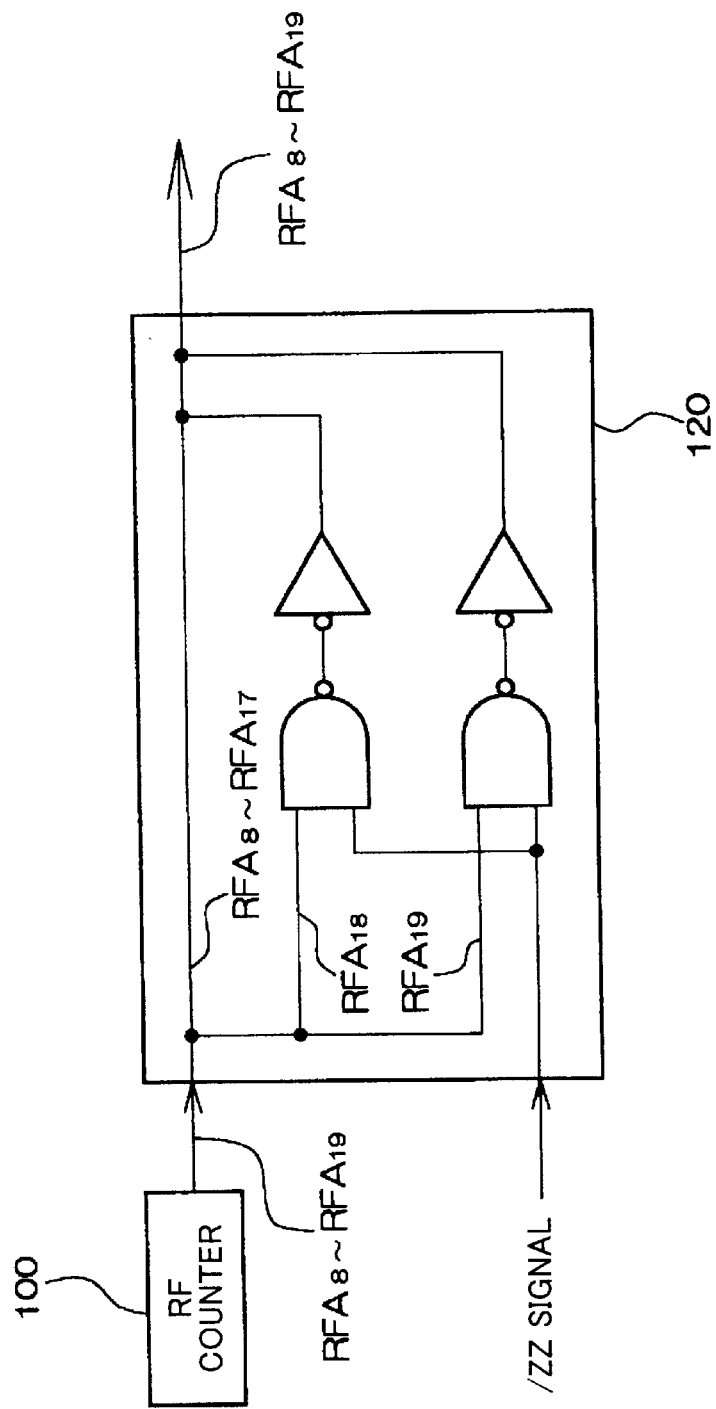
FIG. 9 is a circuit block diagram showing an RF address controller provided in the semiconductor device according to the present embodiment.

The RF address controller 120 is described below in detail. FIG. 9 is a circuit block diagram showing the RF address controller 120. The refresh address signals $RFA_8$ to $RFA_{19}$ output from the RF counter 100 and the snooze signal /ZZ output from the mode controller 110 are input to the RF address controller 120. The logic circuits of the RF address controller 120 are configured so that the following conditions (A) and (B) are satisfied.

(A) When the snooze signal /ZZ is at H level, specifically, in the operating state or the nonselected state, the refresh address signals $RFA_8$ to $RFA_{19}$ from the RF counter 100 are output from the RF address controller 120 at the same level. In this case, all the row addresses are selected by the refresh address signals $RFA_8$ to $RFA_{19}$ in each of the blocks A to D. Therefore, all the memory cells are refreshed in each of the blocks A to D.

Figure 10:
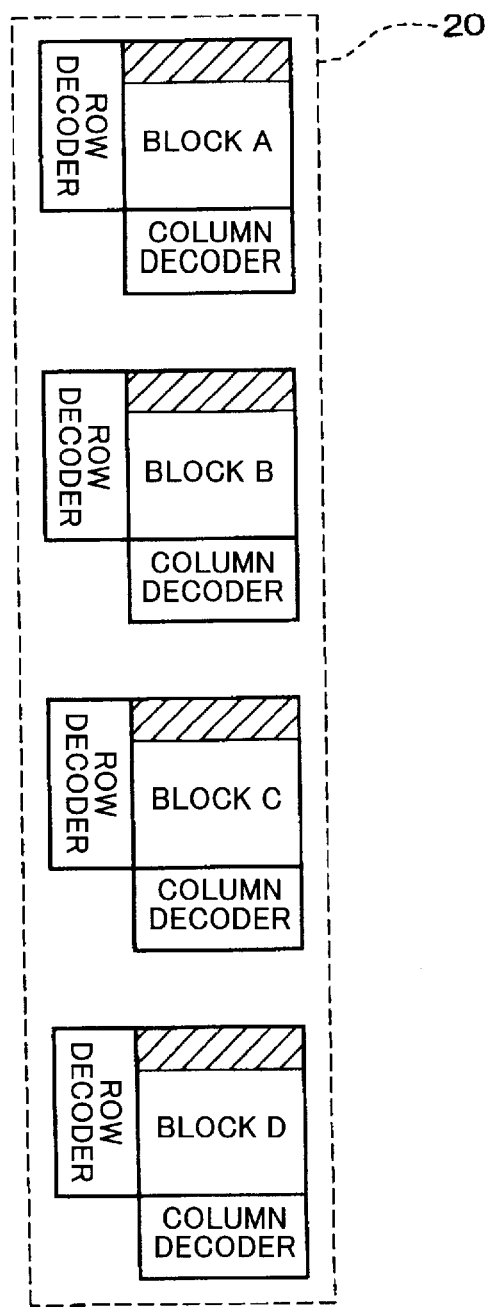
FIG. 10 is a circuit block diagram showing a memory cell array provided in the semiconductor device according to the present embodiment.

(B) When the snooze signal /ZZ is at L level, specifically, in the power saving state, the refresh address signals $RFA_8$ to $RFA_{17}$ among the refresh address signals $RFA_8$ to $RFA_{19}$ from the RF counter 100 are output from the RF address controller 120 at the same level. On the contrary, the refresh address signals $RFA_{18}$ and $RFA_{12}$ are set to L level and output from the RF address controller 120. As a result, since only part of the row addresses are selected in each of the blocks A to D in the power saving state, only part of the memory cells is refreshed in each of the blocks A to D. Specifically, only the memory cells located in the regions of the blocks A to D indicated by the slanted line shown in FIG. 10 are refreshed. Data which must not be lost is stored in these regions.

Only part of the memory cells may be refreshed in each of the blocks A to D in the nonselected state by causing the refresh address signals $RFA_{18}$ and $RFA_{19}$ to be at L level in the same manner as in the power saving state.

Three major effects of the RF address controller 120 are as follows.

7.1 Effect 1

Only part of the memory cell array 20 is refreshed in the power saving state instead of refreshing the entire memory cell array 20. Therefore, since electric power needed for refreshing can be limited in the power saving state, the power consumption can be decreased.

7.2 Effect 2

There is no need to provide an additional backup memory. For example, in the case of a 16-Mbit DRAM, a 4-Mbit SRAM may be used as a backup memory. Data which must not be lost can be stored in the 4-Mbit SRAM in the power saving state of the DRAM, whereby the power consumption is reduced. The present embodiment eliminates a need to provide a backup memory by refreshing only part of the memory cell array 20 in the power saving state of the semiconductor device 1.

7.3 Effect 3

In the power saving state, only part of the memory cell array 20 is refreshed. Therefore, the refresh cycle in the power saving state can be set longer than the refresh cycles in the operating state and the nonselected state. This also reduces the power consumption. This effect is described below in detail.

In the present embodiment, the semiconductor device 1 performs a refreshing operation for the memory cells in the n-th row in each block, and then performs refreshing for the memory cells in the (n+1) th row. This operation is repeatedly performed, whereby the entire memory cell array 20 is refreshed in the operating state and the nonselected state, and only part of the memory cell array 20 is refreshed in the power saving state. A cycle of this operation is a refresh cycle. The refresh cycle can be started at the leading edge of the RF timing signal, for example.

In the present embodiment, since only part of the memory cell array 20 is refreshed in the power saving state, the number of memory cells which must be refreshed is smaller than in the operating state and the nonselected state. Therefore, the refresh cycle in the power saving state can be set longer than the refresh cycles in the operating state and the nonselected state. This is described below using an example.

The rows existing in each of the blocks A to D are defined as 0th to 4095th rows. A period of time in which memory cells can hold data is 128 ms.

In the case where 0th to 4095th rows exist (number of word lines is 4096), specifically, the number of refreshing operations is about 4000 as in the case of the operating state and the nonselected state, the refresh cycle is as follows.

Refresh cycle=128 ms÷4000=32 μs

One fourth of each of the blocks A to D, specifically, 0th to 1023rd rows (number of word lines is 1024) are refreshed in the power saving state. Since the number of refreshing operation is about 1000, the refresh cycle is as follows.

Refresh cycle=128 ms÷1000=128 μs

Therefore, in the case where only one fourth of each of the blocks A to D is refreshed, the refresh cycle can be set four times as long as the refresh cycle in the case of refreshing all rows in each of the blocks A to D. As a result, the power consumption can be reduced in the power saving state.

8. RF Timing Signal Generation Circuit

Figure 11:
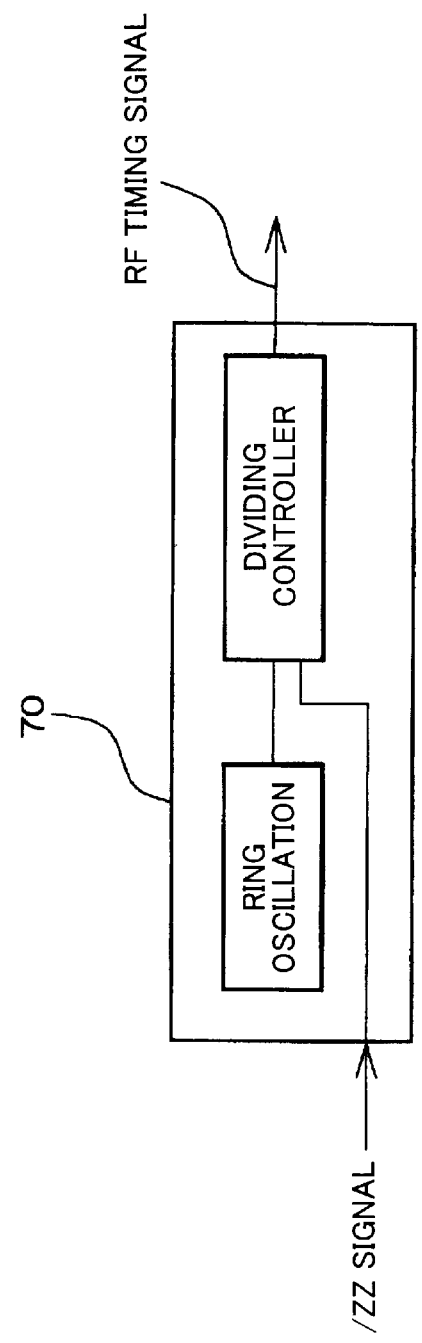
FIG. 11 is a block diagram showing an RF timing signal generation circuit provided in the semiconductor device according to the present embodiment.

The RF timing signal generation circuit 70 is described below. As described in the section "7.3 Effect 3"in "7. RF address controller", the power consumption is decreased by making the refresh cycle in the power saving state longer than the refresh cycles in the operating state or the nonselected state. In the present embodiment, refreshing is started at the leading edge of the RF timing signal. Therefore, the refresh cycle in the power saving state can be set longer than the refresh cycle in the operating state or the nonselected state, by making the cycle of the RF timing signal in the power saving state longer than the cycle of the RF timing signal in the operating state or the nonselected state. This feature can be achieved by the RF timing signal generation circuit 70 shown in FIG. 11.

The RF timing signal generation circuit 70 includes a ring oscillation circuit and a dividing controller. A pulse signal generated from the ring oscillation circuit is input to the dividing controller. The pulse signal output from the dividing controller becomes the RF timing signal which is an output signal from the RF timing signal generation circuit 70. The snooze signal /ZZ output from the mode controller 110 is input to the dividing controller.

Figure 12:
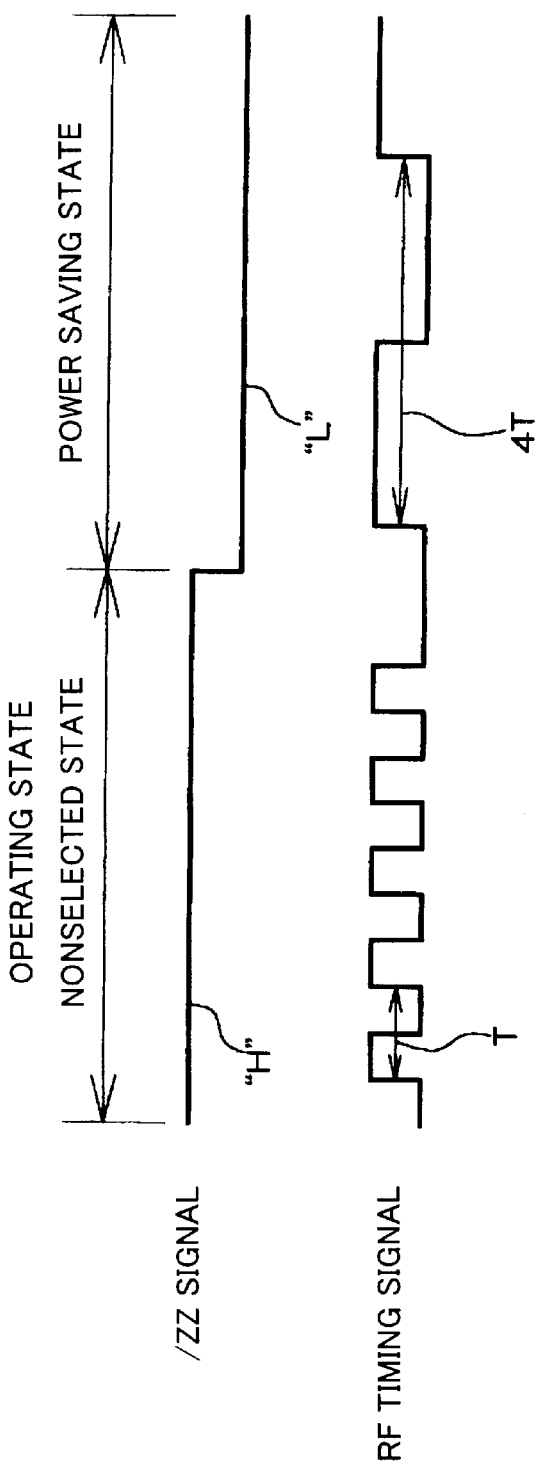
FIG. 12 is a waveform diagram showing the relation between an RF timing signal and a snooze signal /ZZ.

When the snooze signal /ZZ is at H level, specifically, in the operating state and the nonselected state, the signal output from the ring oscillation circuit becomes the RF timing signal with a cycle T by the dividing controller, as shown in FIG. 12. When the snooze signal /ZZ is at L level, specifically, in the power saving state, the signal output from the ring oscillation circuit becomes the RF timing signal with a cycle 4T by the dividing controller.

The dividing controller functions as a refresh cycle control circuit as described above. The refresh cycle in the power saving state can be set longer than the refresh cycles in the operating state and the nonselected state by the dividing controller. Although the dividing controller is provided inside the RF timing signal generation circuit 70, the dividing controller may be provided outside the RF timing signal generation circuit 70.

9. RF Counter Controller

In the present embodiment, refreshing is delayed in the block accessed externally as described in "2.1 Operating state"in "2. Refresh operation of semiconductor device". In the present embodiment, the RF counter controller 90 is provided for enabling reliable refreshing in all the blocks A to D, as shown in FIG. 1.

The RF counter controller 90 outputs the count-up signal after refreshing of the memory cells selected by the word line in the n-th row is completed in all the blocks A to D. This allows the counter value of the RF counter 100 to be incremented by one, whereby the RF counter 100 outputs the refresh address signals $RFA_8$ to $RFA_{19}$ corresponding thereto. This output from the RF counter 100 allows the row predecoders 30A to 30D to supply signals for driving the word line in the (n+1) th row.

Figure 13:
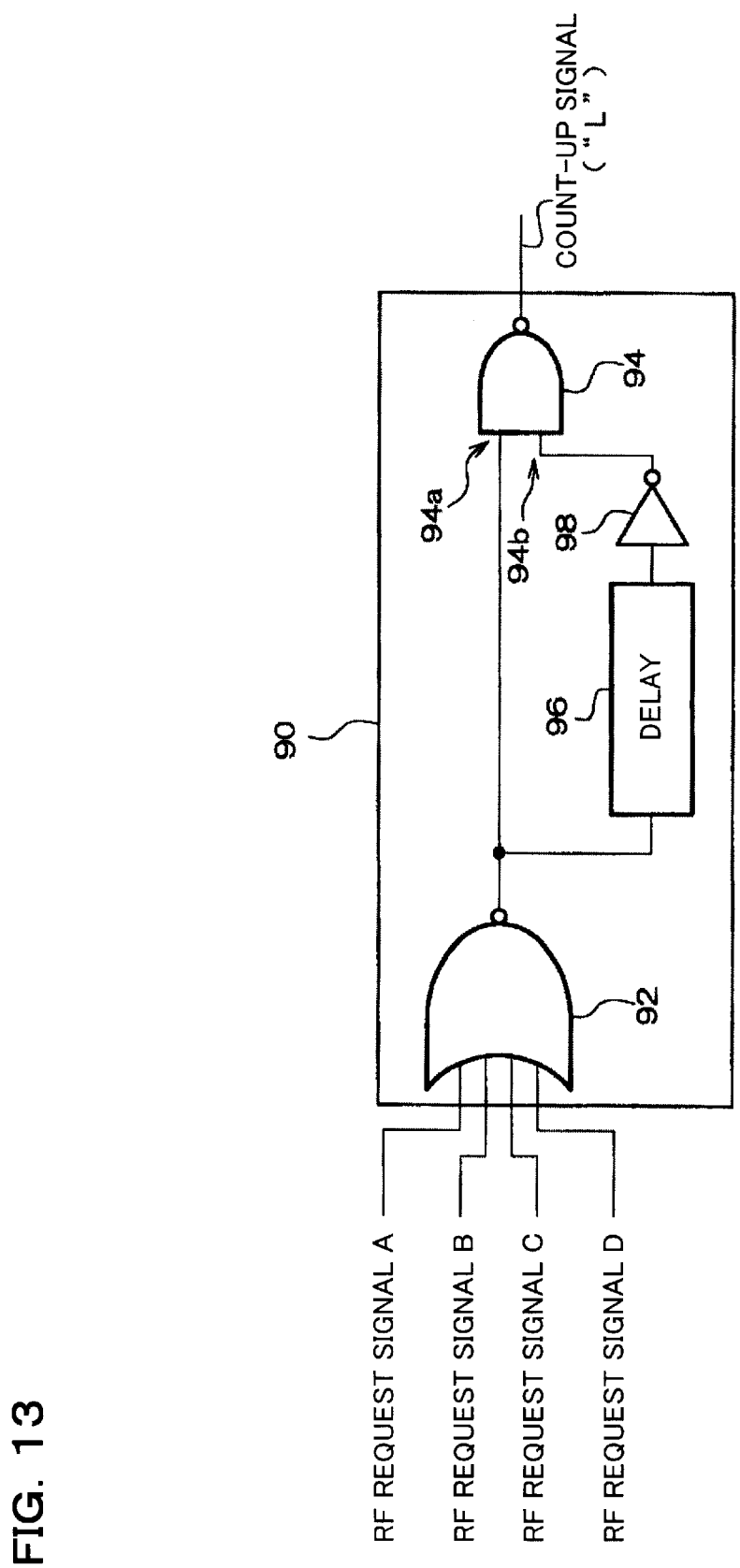
FIG. 13 is a circuit block diagram showing an RF counter controller provided in the semiconductor device according to the present embodiment.

FIG. 13 is a circuit block diagram showing the RF counter controller 90. The RF counter controller 90 includes a NOR gate 92, a NAND gate 94, a delay circuit 96, and an inverter 98.

The RF request signals A to D are input to the NOR gate 92. An output signal from the NOR gate 92 is input to the NAND gate 94. There are two paths for this signal. One is a path directly connecting an output terminal of the NOR gate 92 to an input terminal 94a of the NAND gate 94. The other is a path connecting the output terminal of the NOR gate 92 to an input terminal 94b of the NAND gate 94 through the delay circuit 96 and the inverter 98. An active-low count-up signal is output from the NAND gate 94.

Figure 14:
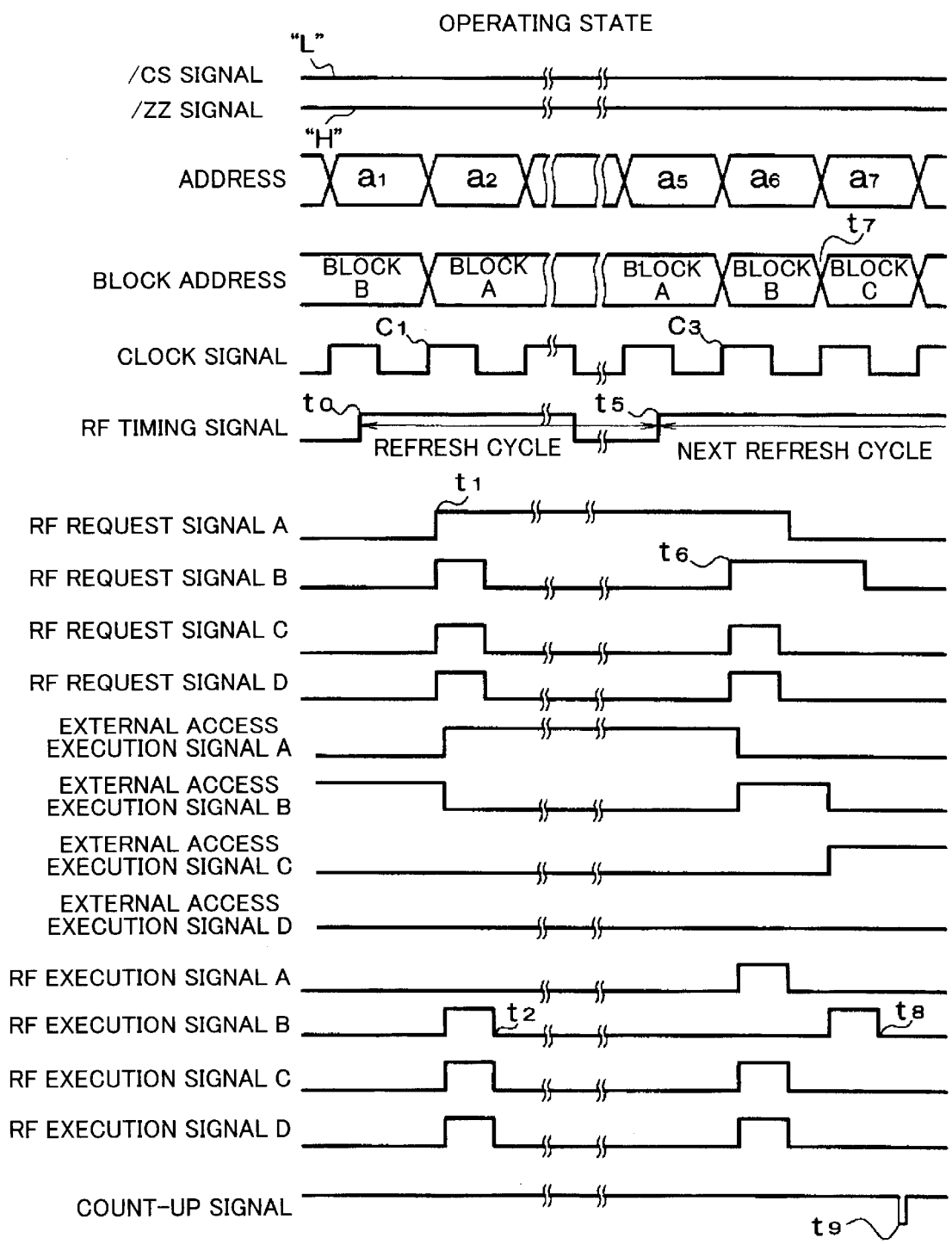
FIG. 14 is a timing chart of the semiconductor device according to the present embodiment in one period in the operating state.

A mechanism for allowing the RF counter controller 90 to output the count up signal is described below with reference to FIGS. 1, 13, and 14. FIG. 14 is a timing chart of the semiconductor device 1 in the operating state during one time period. The chip-select signal /CS is at L level, whereby the semiconductor device 1 is in the operating state.

The operations of the semiconductor device 1 from time $t_0$ to time $t_2$ are the same as the operations from time $t_0$ to time $t_2$ in the timing chart shown in FIG. 2. Specifically, the memory cells selected by the word line in the n-th row are refreshed in the block B, the block C, and the block D.

After the RF timing signal rises to H level (time $t_5$), the RF request signals B to D rise to H level based on the generation of the first clock signal ($C_3$) (time $t_6$)

Since the block A is continuously selected during a period from time $t_1$ to time $t_6$ (refreshing can be performed once in the blocks A to D during this period), the memory cells selected by the word line in the n-th row are not refreshed in the block A (delay of refreshing in one refresh cycle). Therefore, since the RF request signal A remains at H level during this refresh cycle, the NOR gate 92 outputs a signal at L level. Therefore, since the NAND gate 94 outputs a signal at H level during this refresh cycle, the count-up signal is not generated.

Therefore, the memory cells selected by the word line in the same row (n-th row) are refreshed in the blocks A to D during the next refresh cycle. In more detail, since the block B is selected at time $t_6$, the external access execution signal B and the RF execution signals A, C, and D rise to H level. This allows the memory cells selected by the word line in the n-th row to be refreshed in the blocks A, C, and D.

The block address is changed from the block B to the block C at time $t_7$. Since the RF request signal B is at H level, the RF execution signal B rises to H level. This RF execution signal B allows the memory cells selected by the word line in the n-th row to be refreshed in the block B. After a specific period of time has elapsed, the RF request signal B falls to L level. This allows the RF execution signal to fall to L level, whereby refreshing is completed (time $t_8$). Refreshing of the memory cells selected by the word line in the n-th row is thus completed in the blocks A to D.

Since all the RF request signals A to D are at L level at time $t_8$, a signal at H level is output from the NOR gate 92. The signal at H level is immediately input to the input terminal 94a of the NAND gate 94. Since the signal at H level is continuously input to the input terminal 94b, an active-low (L level) count-up signal is output from the NAND gate 94 (time $t_9$). The signal at H level output from the NOR gate 92 passes through the delay circuit 96, is caused to fall to L level by the inverter 98, and is input to the input terminal 94b. Therefore, the signal output from the NAND gate 94 immediately rises to H level.

The counter value of the RF counter 100 is incremented by one by the count-up signal. The RF counter 100 outputs the refresh address signal corresponding thereto, specifically, the address signal corresponding to the row which must be refreshed next. This output from the RF counter 100 allows the row predecoders 30A to 30D to which the refresh execution signals are input to supply signals for refreshing the memory cells selected by the word line in the (n+1) th row which must be refreshed next.

As described above, in the present embodiment, the memory cells selected by the word line in the (n+1) th row are not refreshed until the memory cells selected by the word line in the n-th row are refreshed in all the blocks A to D during one refresh cycle. Therefore, the memory cells in all the rows can be refreshed reliably.

In the case of providing the RF counter controller 90, the refresh cycle must be determined taking into consideration a time period in which memory cells can hold data and the number of refresh operation (number of rows in each of the blocks A to D, or word lines. 4096 in the present embodiment). For example, the cycle of the RF timing signal (refresh cycle) is set at 50 $\mu$s under conditions that the time period in which memory cells can hold data is 200 ms and the number of refreshing cycle is about 4000 (since the number of rows is 4096).

50 $\mu$s÷4000=200 ms

Data cannot be held under these conditions if refreshing is delayed only once. Therefore, the cycle of the RF timing signal (refresh cycle) is set at 45$\mu$s, for example.

45 $\mu$s×4000=180 ms (200 ms−180 ms)÷45 $\mu$s≈444

Data can be held even if the refreshing is delayed up to 444 times by setting the cycle of the RF timing signal (refresh cycle) to 45 $\mu$s.

As shown in FIG. 14, the memory cells connected to the word line in the n-th row have not been refreshed in the block A during one refresh cycle (time $t_0$ to time $t_5$). In the present embodiment, the memory cells connected to the word line in the n-th row (same row) are refreshed in the next refresh cycle (after time $t_5$). However, the present embodiment is not limited thereto. The memory cells connected to the word line in the (n+1) th row may be refreshed.

10. Application Example of Semiconductor Device to Electronic Instrument

Figure 15:
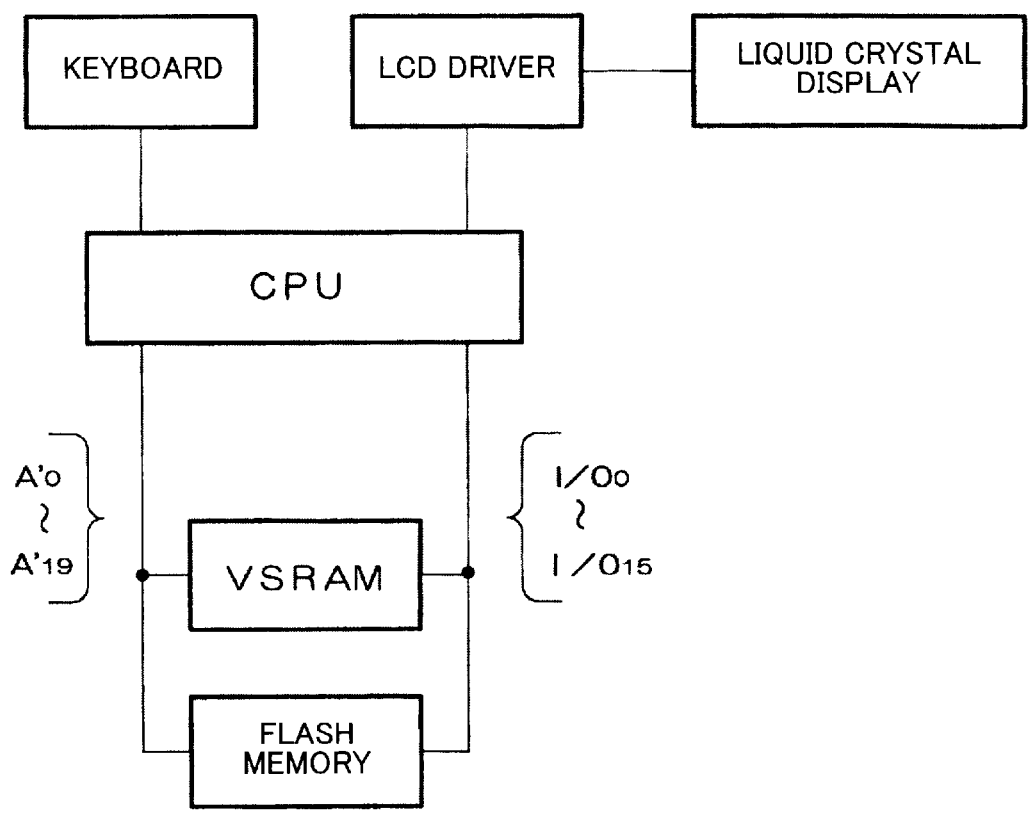
FIG. 15 is a circuit block diagram showing a system for portable telephones having the semiconductor device according to the present embodiment.

The semiconductor device 1 maybe applied to an electronic instrument such as portable equipment. FIG. 15 is a block diagram showing part of a system for portable telephones. The semiconductor device 1 is a VSRAM. A CPU, VSRAM, and flash memory are connected through bus lines for the address signals $A'_0$ to $A'_{19}$. The CPU, VSRAM, and flash memory are connected through bus lines for the data signals $I/O_0$ to $I/O_{15}$. The CPU is connected to a keyboard and an LCD driver through the bus lines. The LCD driver is connected to a liquid crystal display section through the bus lines. The CPU, VSRAM, and flash memory make up a memory system.

Figure 16:
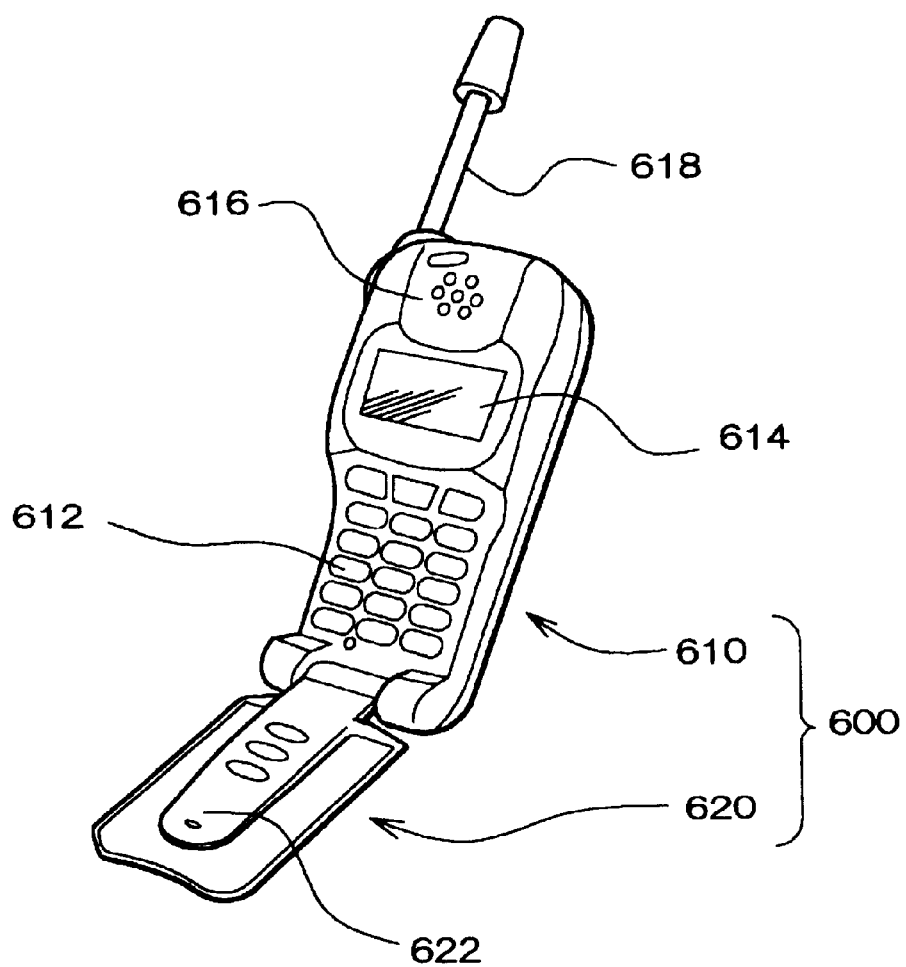
FIG. 16 is an oblique view showing a portable telephone having the system for portable telephones shown in FIG. 15.

FIG. 16 is an oblique view showing a portable telephone 600 provided with the system for portable telephones shown in FIG. 15. The portable telephone 600 includes a keyboard 612, a liquid crystal display section 614, a body section 610 including a receiver section 616 and an antenna section 618, and a cover 620 including a transmitter section 622.

What is claimed is:

1. A method of refreshing a semiconductor device having a memory cell array divided into a plurality of blocks, the method comprising:
   a first step of making the semiconductor device externally accessible;
   a second step of refreshing a block other than a block to be externally accessed among the plurality of blocks of the memory cell array when the semiconductor device is in an externally accessible state;
   a third step of making the semiconductor device externally inaccessible; and
   a fourth step of refreshing only part of the memory cell array when the semiconductor device is in an externally inaccessible state.

2. The method of refreshing a semiconductor device as defined in claim 1,
   wherein a first refresh cycle in the externally inaccessible state of the semiconductor device is longer than a second refresh cycle in the externally accessible state of the semiconductor device.

3. The method of refreshing a semiconductor device as defined in claim 2, wherein the first refresh cycle is two to ten times as long as the second refresh cycle.

4. The method of refreshing a semiconductor device as defined in claim 1, wherein the part of the memory cell array to be refreshed in the fourth step has a specific address of data to be held.

5. The method of refreshing a semiconductor device as defined in claim 4, further comprising:

a fifth step of generating a refresh address signal which is formed of a plurality of signals and is used to select a memory cell to be refreshed in the memory cell array, wherein the fourth step includes a sixth step of making logic of part of the signals forming the refresh address signal constant so that only part of each block of the plurality of blocks is refreshed.

6. The method of refreshing a semiconductor device as defined in claim 5, further comprising:

a seventh step of selecting a word line of each block of the plurality of blocks so that only part of each block of the plurality of blocks is refreshed, after the sixth step.

7. The method of refreshing a semiconductor device as defined in claim 5, further comprising:

an eighth step of selecting a row address of each block of the plurality of blocks so that only part of each block of the plurality of blocks is refreshed, after the sixth step.

8. The method of refreshing a semiconductor device as defined in claim 1, wherein the third step is carried out when the semiconductor device enters a standby state.

9. The method of refreshing a semiconductor device as defined in claim 1, wherein the third step is carried out when the semiconductor device enters a power saving state.

10. The method of refreshing a semiconductor device as defined in claim 1, wherein the third step is carried out when the semiconductor device is in a nonselected state in which a chip select signal for selecting the semiconductor device is non-active.

11. A semiconductor device which holds data by refreshing, comprising:

a memory cell array divided into a plurality of blocks;

a refresh address signal generation circuit which generates a first refresh address signal formed of a plurality of signals and is used to select a memory cell to be refreshed in each of the blocks;

a refresh address signal control circuit which generates a second refresh address signal in which logic of part of the signals forming the refresh address signal is made constant in an externally inaccessible state; and a refresh control circuit which refreshes a memory cell in a block other than a block to be externally accessed among the plurality of blocks, based on the first refresh address signal in an externally accessible state of the semiconductor device, and also refreshes a memory cell in each of the blocks, based on the second refresh address signal in the externally inaccessible state.

12. The semiconductor device as defined in claim 11, further comprising:

a refresh cycle control circuit which makes a first refresh cycle in the externally inaccessible state of the semiconductor device longer than a second refresh cycle in the externally accessible state of the semiconductor device.

13. The semiconductor device as defined in claim 12, wherein the refresh cycle control circuit sets the first refresh cycle two to ten times as long as the second refresh cycle.

14. The semiconductor device as defined in claim 11, further comprising:

a plurality of predecoders respectively provided for the plurality of blocks, wherein each of the predecoders generates a signal for driving a word line which selects a memory cell based on the refresh address signal.

15. The semiconductor device as defined in claim 11, wherein the refresh control circuit comprises:

a plurality of refresh request signal generation circuits each of which is provided for each of the blocks and generates a refresh request signal to each of the blocks; and a plurality of block controllers each of which is provided for each of the blocks and generates a refresh execution signal to the memory cell located in a block other than a block to be externally accessed among the plurality of blocks, based on the refresh request signal.

16. The semiconductor device as defined in claim 11, further comprising a snooze terminal, wherein the semiconductor device is made externally inaccessible when a snooze signal input to the snooze terminal is active.

17. The semiconductor device as defined in claim 11, further comprising a chip select terminal, wherein the semiconductor device is made externally inaccessible when a chip select signal input to the chip select terminal is non-active.

18. The semiconductor device as defined in claim 11, comprising a virtually static RAM (VSRAM).

19. A memory system comprising the semiconductor device as defined in claim 11.

20. An electronic instrument comprising the semiconductor device as defined in claim 11.

* * * * *